(12) United States Patent
Yao

(10) Patent No.: US 7,732,103 B2
(45) Date of Patent: Jun. 8, 2010

(54) PHOTOMASK, FOCUS MEASUREMENT APPARATUS AND FOCUS MEASUREMENT METHOD

(75) Inventor: Teruyoshi Yao, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 644 days.

(21) Appl. No.: 11/606,066

(22) Filed: Nov. 30, 2006

(65) Prior Publication Data
US 2008/0020294 A1   Jan. 24, 2008

(30) Foreign Application Priority Data
Jul. 21, 2006   (JP)   ............................. 2006-199801

(51) Int. Cl.
*G03F 1/00*   (2006.01)
(52) U.S. Cl. .............................. 430/5; 430/311; 355/55; 355/77
(58) Field of Classification Search ...................... 430/5, 430/311; 355/55, 77
See application file for complete search history.

(56) References Cited

U.S. PATENT DOCUMENTS

| | | | |
|---|---|---|---|
| 2004/0196447 A1* | 10/2004 | Watanabe | 355/77 |
| 2005/0229148 A1* | 10/2005 | Melvin, III | 716/21 |
| 2006/0187436 A1* | 8/2006 | Nelson et al. | 355/55 |
| 2006/0216616 A1* | 9/2006 | Shin et al. | 430/5 |

FOREIGN PATENT DOCUMENTS

JP   2004-172600 A   6/2004

\* cited by examiner

*Primary Examiner*—Mark F Huff
*Assistant Examiner*—Rashid Alam
(74) *Attorney, Agent, or Firm*—Fujitsu Patent Center

(57) ABSTRACT

A test photomask includes a first mask pattern and a second mask pattern formed at a center portion of the first mask pattern thereon. The first mask pattern is a pattern with light condensing effect and a nature in which an exposure-dose amount to a transfer object varies in dependence on a focus variation, which is a two-dimensional Fresnel zone pattern here.

19 Claims, 20 Drawing Sheets

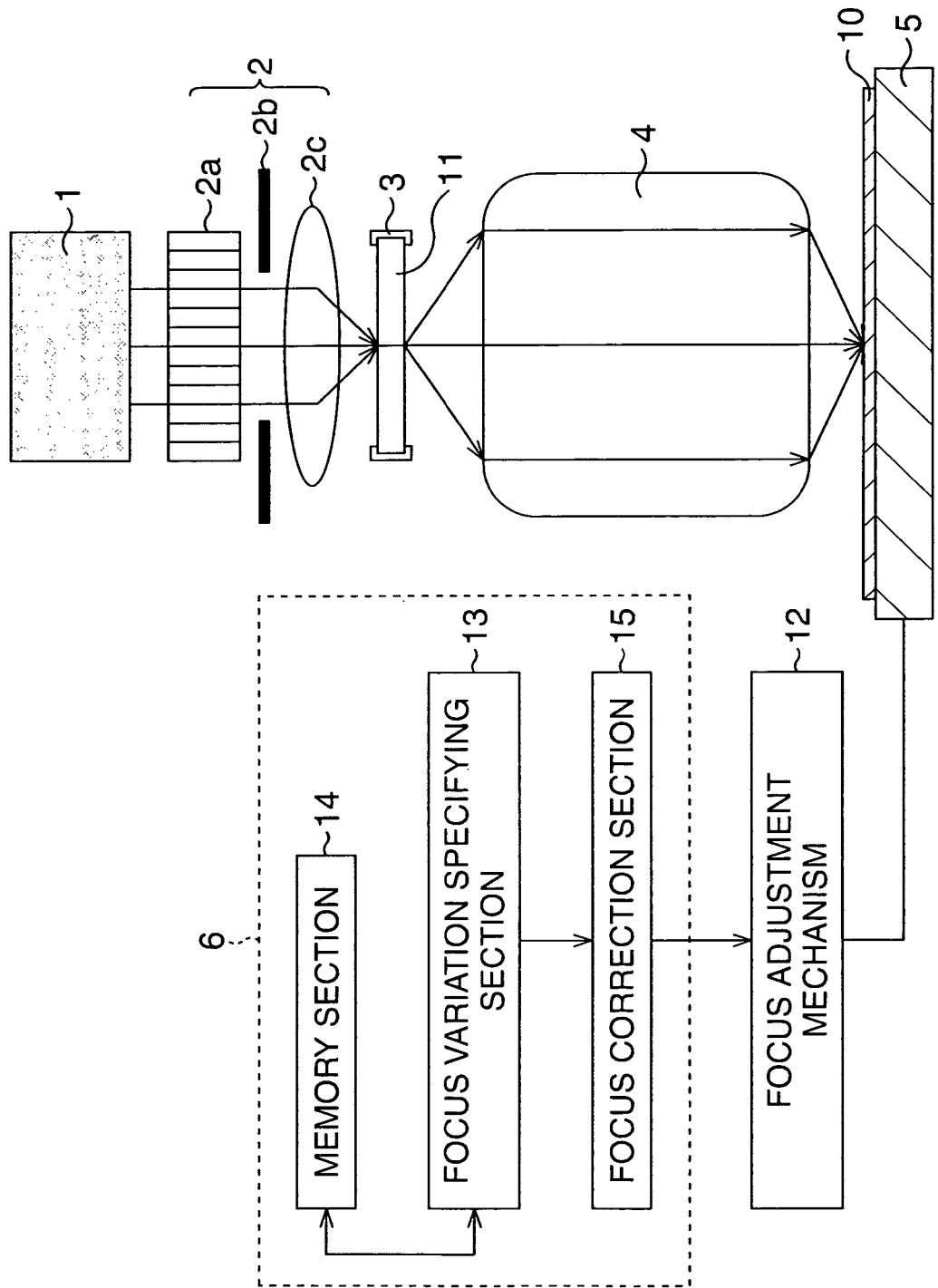

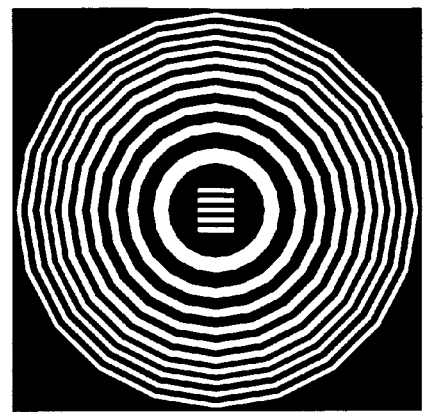
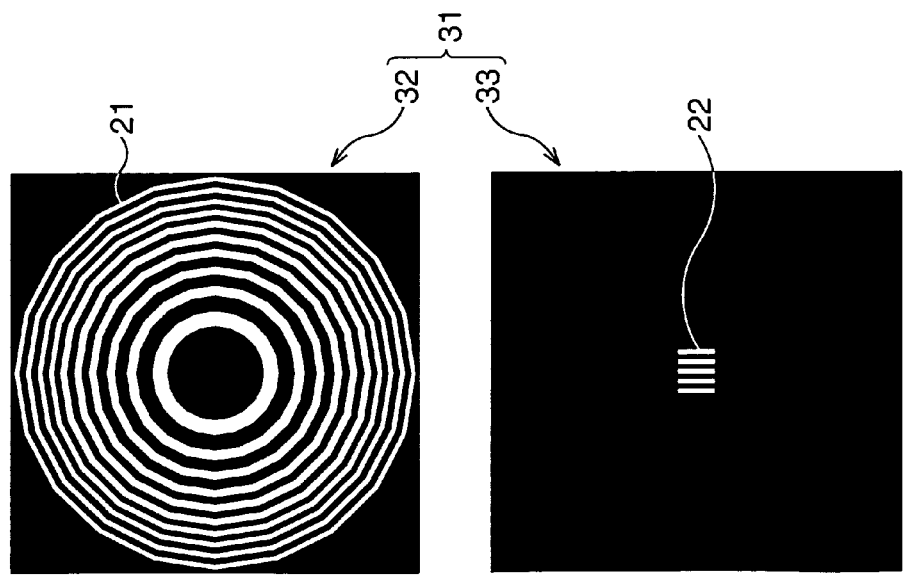
FIG. 12

PHOTOMASK, FOCUS MEASUREMENT APPARATUS AND FOCUS MEASUREMENT METHOD

CROSS-REFERENCE TO RELATED APPLICATIONS

This application is based upon and claims the benefit of priority from the prior Japanese Patent Application No. 2006-199801, filed on Jul. 21, 2006, the entire contents of which are incorporated herein by reference.

BACKGROUND OF THE INVENTION

1. Field of the Invention

The present invention relates to a photomask, a focus measurement apparatus and a focus measurement method, which are used for lithography when forming a semiconductor device.

2. Description of the Related Art

In recent years, patterns for semiconductor elements are demanded strict size precision. In a projecting aligner (hereinafter called the "aligner") used to form a pattern, which projects and exposes a mask pattern by way of reduction to form an image of the pattern on a semiconductor wafer, there arises a problem that the size of a resist pattern after development varies when an image-formed position, namely a focus position, shifts.

Hence, although it is preferable that the focus position of the aligner does not shift, the focus position varies in some degree in practice, requiring aligner management such that a shifted amount of the focus position of the aligner is measured at regular intervals to correct a difference in depth of focus. In addition, it is required that difference in the focus position when an actual product is formed by patterning is recognized and the difference is corrected for the next exposure.

A generally-used measurement method of the focus position is that measuring the sizes of the exposed patterns one by one while changing the focus. The focus position of an isolated residual pattern formed by a positive-type resist is obtained by making use of the fact that the size is the largest at the focus position.

Further, there is proposed a method specifying a defocus amount by measuring a positional difference amount varying in accordance with the focus variation by adding an assist pattern to a positional difference test mark, in Japanese Patent Application Laid-Open No. 2004-172600 (Patent document 1).

In the method measuring the size of the transferred pattern exposed by way of changing the focus, the focus position cannot be obtained by a single exposure, leaving a problem that the difference in the focus position when the pattern of a product is exposed cannot be obtained. Also, in the method of Patent document 1, the positional difference with respect to the focus variation is small, leaving a problem that the focus variation cannot be specified with high precision.

SUMMARY OF THE INVENTION

The present invention has been made in consideration of the above-described problems and an object thereof is to provide a photomask, a focus measurement apparatus and a focus measurement method capable of obtaining a position in focus, namely a best focused position, easily and surely by a single exposure with high precision to thereby perform a highly-reliable patterning speedy by enabling a focus measurement with high precision in an extremely short period of time.

A photomask according to the present invention is a photomask transferring a mask pattern to a transfer object by exposure, including: a first mask pattern with light condensing effect, an exposure-dose amount of the first mask pattern to the transfer object varying in dependence on a focus variation; and a second mask pattern for size measurement formed to be projected to a light condensed portion by the first mask pattern when exposed, in which a size of a transferred pattern of the second mask pattern varies caused by the variation in the exposure-dose amount from the first mask pattern arising in dependence on the focus variation.

A photomask according to the present invention is a photomask transferring a mask pattern to a transfer object by exposure, in which the mask pattern includes a Fresnel zone pattern with light condensing effect, an exposure-dose amount of the Fresnel zone pattern to the transfer object varying in dependence on a focus variation.

A focus measurement apparatus according to the present invention includes: a photomask including a first mask pattern with light condensing effect of which exposure-dose amount to a transfer object varies in dependence on a focus variation and a second mask pattern for size measurement formed to be projected to a light-condensed portion of the first mask pattern when exposed, and a focus variation amount specifying unit specifying a focus variation amount by making use of a fact that the size of a transferred pattern of the second mask pattern varies caused by variation in the exposure-dose amount from the first mask pattern arising in dependence on the focus variation and by checking the measured size value with data showing a relation between the size obtained in advance using the photomask and the focus variation amount.

A focus measurement apparatus according to the present invention includes: a photomask including a Fresnel zone pattern with light condensing effect by diffraction, an exposure-dose amount of the Fresnel zone pattern to a transfer object varying in dependence on a focus variation; and a focus variation amount specifying unit specifying a focus variation amount by making use of a fact that the exposure-dose amount from the Fresnel zone pattern to a resist film being the transfer object depends on the focus variation and a film thickness of the resist film after development process depends on the exposure-dose amount and by checking a measured film thickness value of the resist film with data showing a relation between the film thickness of the resist film obtained in advance using the photomask and the focus variation amount.

A focus measurement apparatus according to the present invention includes: a photomask including a Fresnel zone pattern with light condensing effect by diffraction formed thereon, an exposure-dose amount of the Fresnel zone pattern to a transfer object varying in dependence on a focus variation; an exposure-dose amount measurement unit measuring the exposure-dose amount from the Fresnel zone pattern; and a focus variation amount specifying unit specifying a focus variation amount by making use of a fact that the exposure-dose amount from the Fresnel zone pattern depends on the focus variation and by checking a measured value of the exposure-dose amount by the exposure-dose amount measurement unit with data showing a relation between the exposure-dose amount obtained in advance using the photomask and the exposure-dose amount measurement unit and the focus variation amount.

A focus measurement method according to the present invention includes the step of specifying a focus variation amount by using a photomask including a first mask pattern with light condensing effect of which exposure-dose amount to a transfer object varies in dependence on a focus variation and a second mask pattern for size measurement formed to be projected to a light condensed portion of the first mask pattern when exposed while making use of a fact that the size of a transferred pattern of the second mask pattern varies caused by variation in the exposure-dose amount from the first mask pattern arising in dependence on the focus variation and by checking the measured size value with data showing a relation between the size obtained in advance using the photomask and the focus variation amount.

A focus measurement method according to the present invention includes the step of specifying a focus variation amount by using a photomask including a Fresnel zone pattern with light condensing effect formed thereon, an exposure-dose amount of the Fresnel zone pattern to a transfer object varying in dependence on a focus variation, while making use of a fact that the exposure-dose amount from the Fresnel zone pattern to a resist film being the transfer object depends on the focus variation and at the same time the film thickness of the resist film after development depends on the exposure-dose amount, and by checking a measured film thickness value of the resist film with data showing a relation between the film thickness of the resist film obtained in advance using the photomask and the focus variation amount.

A focus measurement method according to the present invention includes the steps of: measuring an exposure-dose amount from a Fresnel zone pattern with light condensing effect by diffraction using a photomask including the Fresnel zone pattern formed thereon, the exposure-dose amount of the Fresnel zone pattern varying in dependence on a focus variation; and specifying a focus variation amount by making use of a fact that the exposure-dose amount from the Fresnel zone pattern depends on the focus variation and by checking the measured value of the exposure-dose amount with data showing a relation between the exposure-dose amount obtained in advance by the exposure-dose amount measurement using the photomask and the focus variation amount.

BRIEF DESCRIPTION OF THE DRAWINGS

FIG. 1 is a schematic view showing an outline structure of an exposure system according to a first embodiment;

FIG. 12 is a schematic plan view showing a structure of a test photomask according to the second embodiment.

DETAILED DESCRIPTION OF THE PREFERRED EMBODIMENTS

Basic Gist of Present Invention

Figure 2A:
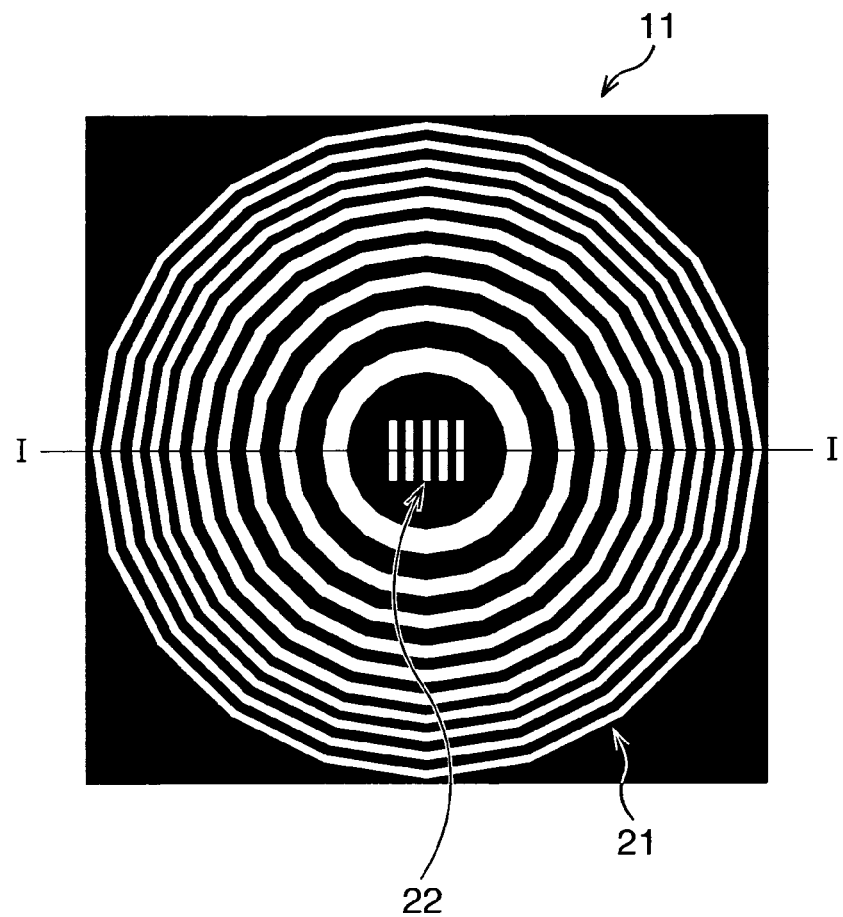
FIGS. 2A and 2B are schematic plan views showing a structure of a test photomask according to the first embodiment.

In lithography, there arises variation in size of a transferred pattern of a mask pattern formed on a photomask, namely the size of a resist pattern formed by processing a resist film by the lithography, due mainly to focus variation of an aligner (shift in a focus position) and variation in doze amount of exposure light (exposure-dose amount) of a light source.

However, when the size variation is observed in the resist pattern, it is difficult to determine that the size variation is due to either the focus variation or the variation in the exposure-dose amount in the aligner. Accordingly, it is difficult to correct the size variation with precision only by measuring the size variation amount of the resist pattern.

In recent aligners, it is considered that, as a cause of the size variation of the resist pattern, the focus variation affects the size variation dominantly as compared to the variation in exposure energy. The present inventor has conceived the present invention to measure the amounts of the size variation easily and precisely by a single exposure for those arising from the focus variation.

In the present invention, as a basic structure, the size variation amount is specified by performing an exposure using a photomask including a pattern with a light condensing effect and a nature that the exposure dose-amount to a transfer object varies in dependence on the focus variation, as a mask pattern. Here, as a specific example of the above-described mask pattern, a so-called Fresnel zone pattern with the light condensing effect by diffraction is preferable. When the exposure is performed using the photomask including the Fresnel zone pattern as a mask pattern, the dose amount of a diffracted light from the Fresnel zone pattern to the transfer object varies in dependence on the focus variation. In the present invention, based on the above-described basic structure as a main axis, respective specific structures (1) to (3) described below are presented.

Specific Structure of Present Invention (1)

In the specific structure (1), a photomask (test photomask) including, in addition to the above-described mask pattern which is defined as a first mask pattern, a second mask pattern for size measurement formed to be projected to a light-condensed portion by a first mask pattern will be presented. By the exposure using the test photomask, the exposure-dose amount to the projected image of the second mask pattern varies caused by the variation in the exposure-dose amount from the first mask pattern arising in dependence on the focus variation. With this variation in the exposure-dose amount, the size of the projected image of the second mask pattern (in other words, the size of a resist pattern formed by the development of a resist film having the image projected thereon) varies. As a second mask pattern, a pattern (line and space (L &S) pattern in which plural linear patterns are arranged in parallel at predetermined intervals is preferable for the reason stated later.

First, an exposure is performed using the test photomask by assigning plural values to the focus variation amount, and data (first data) showing the relation between the size of the resist pattern and the focus variation amount is prepared in advance. When the L & S pattern is used as a second mask pattern for size measurement, the size variation caused by the focus variation is extremely small when the first mask pattern is not provided. With the provision of the first mask pattern, the size variation by the focus variation increases largely. Therefore, in other words, the focus variation can be recognized with extremely high sensitivity.

After that, the exposure is performed by the aligner using the test photomask and the measured size value of the resist pattern is checked with the first data. With this, the focus variation amount can be specified. In other words, the focus variation amount of the aligner can be specified easily and precisely by the single exposure using the test photomask.

Further, in the specific structure (1), the precision of the focus variation amount to be specified can be increased as much as possible as described below.

In the first data obtained using the test photomask (first test photomask) including the first mask pattern and the second mask pattern (L & S pattern), the size value of the resist pattern corresponding to the case where the focus variation amount is 0 (zero) (in focus) can be regarded briefly as a value measured in the state without the affection by the light irradiation from the first mask pattern. Specifically, in the state in focus, the measured size value obtained using the first test photomask is almost the same as the measured size value obtained using the photomask including only the second mask pattern as a mask pattern.

When the exposure is performed using the first test photomask, in the state in focus, the measured size value of the second mask pattern is affected only by the exposure energy variation.

Meanwhile, as described above, in the case of the L & S pattern, the size variation of the resist pattern due to the focus variation is extremely small. Accordingly, when the photomask with only the second mask pattern for measurement being the L & S pattern as a mask pattern without the first mask pattern is used, the relation between the size of the resist pattern and the focus variation amount is depicted by an extremely modest curve in which the size value scarcely depends on the focus variation amount. Accordingly, when the size value is deemed as a steady value, the steady value is the same as the measured size value of the second mask pattern when the first test photomask is in the state in focus.

In the present invention, by making use of the above observed result, as for the first data obtained using the first test photomask, modified data (second data) being the respective size values corresponding to the respective focus variation amounts subtracting the size value corresponding to the case in focus therefrom is prepared in advance.

In the first data, the size value of the resist pattern is the value slightly affected by the exposure energy variation in addition to the effect of the focus variation. Meanwhile, in the first data, the size value of the resist pattern in the state in focus can be seen as the value affected only by the focus variation in which the effect by the exposure energy variation is eliminated as described above. Accordingly, the above-described second data is the data showing the relation between the size variation value affected only by the focus variation in which the effect by the exposure energy variation is eliminated and the focus variation amount, for the second mask pattern.

Here, the exposure is performed using a second test photomask including a third mask pattern being the same pattern as the second mask pattern at a position distant from the first mask pattern and second mask pattern (L & S pattern) appropriately (to the extent that they are not affected by the mutual exposures) together with the first ant second mask pattern. Then, a difference value being the measured size value of the resist pattern of the second mask pattern subtracting the measured size value of the resist pattern of the third mask pattern therefrom is calculated. The difference value is size variation value affected only by the focus variation in which the effect of the exposure energy variation is eliminated.

The difference value is checked with the second data. Backed by this, the focus variation amount can be specified. This focus variation amount is the focus variation amount with higher precision (purity) in which the effect of the exposure energy variation is eliminated. Specifically, the focus variation amount of the aligner can be specified easily and precisely by the single exposure using the second test photomask.

Specific Structure of Present Invention (2)

In the specific structure (2), a photomask (test photomask) including only a pattern with nature in which the focus variation amount varies in dependence on the exposure-dose amount, which is a Fresnel zone pattern here, as a mask pattern, will presented. The present invention makes use of the facts that the exposure-dose amount to the resist film being the transfer object from the Fresnel zone pattern depends on the focus variation and that the film thickness of the resist film after the development process depends on the exposure-dose amount.

First, an exposure is performed using the test photomask by assigning plural values to the focus variation amount, and data showing the relation between the size of the resist film after the development and the focus variation amount is obtained in advance. Here, for example, for the purpose of convenience of obtaining the data, the data showing the relation between the film thickness of the resist film and the focus variation amount may be prepared by obtaining the data with respect to the relation between the film thickness of the resist film and the exposure-dose amount and the relation between the exposure-dose amount and the focus variation amount, respectively, and by combining them.

Next, the exposure is performed by the aligner using the test photomask and the measured film thickness value of the resist film after the development is checked with the above data. With this, the focus variation amount can be specified. In other words, the focus variation amount of the aligner can be specified easily and precisely by the single exposure using the test photo mask.

Specific Structure of Present Invention (3)

In the specific structure (3), a photomask (test photomask) including only a pattern with nature in which the focus variation amount varies in dependence on the exposure-dose amount, which is the Fresnel zone pattern here, as a mask pattern, will be presented as in the specific structure (2). The present invention makes use of the fact that the exposure-dose amount from the Fresnel zone pattern to the transfer object depends on the focus variation.

First, the exposure is performed by using the test photomask and an exposure-dose-amount measurer measuring the exposure-dose amount of the test photomask from the Fresnel zone pattern by assigning plural values to the focus variation amount, and the data showing the relation between the exposure-dose amount and the focus variation amount is obtained in advance.

Then, the measured exposure-dose amount is checked with the above data. Backed by this, the focus variation amount can be specified. In other words, the focus variation amount of the aligner can be specified easily and precisely by the single exposure using the test photomask, and that, it is possible without transferring any pattern to the transfer object practically.

SPECIFIC EMBODIMENTS APPLYING PRESENT INVENTION

Hereinafter, specific embodiments applying the present invention will be described in detail with reference to the drawings.

First Embodiment

FIG. 1 is a schematic view showing an outline structure of an exposure system according to a first embodiment.

The exposure system performs a so-called reduced projection exposure and includes an illumination light source 1 irradiating exposure light, a condensing optical system 2 condensing the irradiated exposure light to a desired portion of a photomask, a reticle stage 3 to place and secure the photomask thereon, a projection optical system 4 projecting the exposure light passed through the mask pattern of the photomask to a desired portion of a transfer object, a wafer stage 5 to place and secure the transfer object thereon, and a focus control system 6 measuring and correcting focus variation of the exposure light on the transfer object.

The illumination light source 1 is, for example, an ArF excimer laser that irradiates ArF excimer laser light of a wave length of 193 nm as exposure light.

The condensing optical system 2 includes a fly-eye lens 2a, an illumination reducer (illumination σ) 2b reducing the exposure light passed through the lens 2a and a lens 2c condensing the exposure light.

On the reticle stage 3, a photomask provided with various mask patterns for reduced projection is placed to be secured. In the present embodiment, a test photomask 11 provided with a test mask pattern to measure and correct the focus variation is placed thereon.

The wafer stage 5 is to place and secure a semiconductor wafer 10 having a resist film being a transfer object formed on the surface thereof, and includes a focus adjustment mechanism 12 to focus the exposure light from the projection optical system 4 by adjusting the position of the wafer stage 5 placed and secured.

The focus control system 6 includes a focus variation specifying section 13 specifying the focus variation amount of the exposure light in the resist film, which is a transfer object, for the exposure system; a memory section 14 storing data showing the relation between the size of a transferred pattern and the focus variation amount and used in the focus variation specifying section 13; and a focus correction section 15 instructing the focus adjustment mechanism 12 to correct the focal point based on the measurement by the focus variation specifying section 13.

The exposure system according to the present embodiment includes the test photomask 11, the focus variation specifying section 13 and the electrode 14 to constitute a focus measurement apparatus.

As shown in FIG. 2A, the test photomask 11 is composed of a first mask pattern 21 formed and a second mask pattern 22 formed and provided at a center portion of the first mask pattern 21.

The first mask pattern 21 is a pattern with light condensing effect and a nature in which the exposure-dose amount to the transfer object varies in dependence on the focus variation, which is a two-dimensional Fresnel zone pattern here. The Fresnel zone pattern is the pattern formed by arranging transparent portions of a zone in parallel and concentrically so as to satisfy an equation (1) shown below, in which the transparent portion and a non-transparent portion are repeated alternately.

When the parallel light (light vertical to the face of the photomask) enters into the Fresnel zone pattern, the light diffracted through the transparent portion is designed to converge on a center point of a circle. A radius Rn of a concentric circle of the Fresnel zone pattern is expressed by the equation (1) below.

$$Rn = [\lambda P(2n-1)/2]^{1/2} \quad (1)$$

Here, "Rn" is a radius of a circle, "λ" is a wave length of the exposure light irradiated from the light source, "P" is a distance between the face of the photomask and the point on which the diffracted light from the Fresnel zone pattern converges, namely a focal distance, and "n" is a natural number.

When the equation (1) is modified to have a left side: $(2n-1)^{1/2}$, then the equation becomes as follows:

$$(2n-1)^{1/2} = (2/\lambda P)^{1/2} \cdot Rn$$

Figure 3:
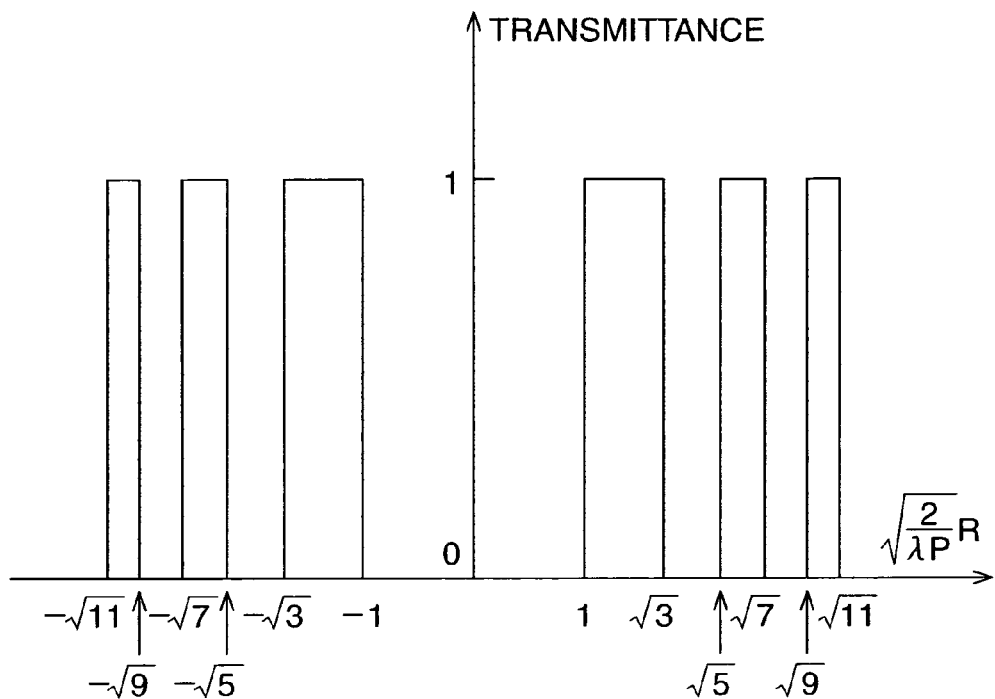
FIG. 3 is a characteristic view showing a transmittance distribution of exposure light of the test photomask in the first embodiment.

In FIG. 3, transmittance distribution of the exposure light at a line segment I-I in FIG. 2A passing through the center of the first mask pattern 21 being the Fresnel zone pattern is shown. Here, the horizontal axis is defined as $(2/\lambda P)^{1/2} \cdot Rn$. When "n" is an even number, then the first mask pattern 21 is a negative Fresnel zone pattern in which the even-numbered zones from the center in the first mask pattern 21 are transparent and a disc-shaped portion at the center is non-transparent.

In the present embodiment, the Fresnel zone pattern in which the wave length of the exposure light and the focal distance are designed to be 193 nm and 1000 nm, respectively, is used. In this case, the inside diameter and the outside diameter of the first transparent zone from the center of the Fresnel zone pattern are 0.311 μm and 0.538 μm, respectively, the inside diameter and the outside diameter of the a second transparent zone from the center thereof are 0.695 μm and 0.822 μm, respectively, and the inside diameter and the outside diameter of the a third transparent zone from the center thereof are 0.932 μm and 1.030 μm, respectively. These sizes show the size of the transferred pattern that is projection exposed onto the transfer object, and the sizes on the photomask are those multiplied by the projection magnification. Further, the radius of the zone not necessarily satisfies the equation (1), and may be optimized under various conditions such as optical conditions in use.

Figure 2B:
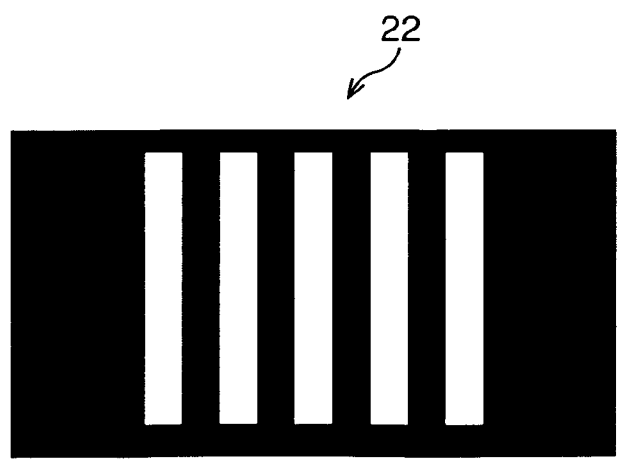

As shown in FIGS. 2A, 2B (FIG. 2B is an enlarged view of the second mask pattern 22), the second mask pattern 22 is the pattern for size measurement that is provided at the center portion of the first mask pattern 21 so that it is projected onto the portion onto which the light is condensed by the first mask pattern 21 when exposed, and is defined as the line and space (L & S) pattern having plural linear patterns arranged in parallel at predetermined intervals here. Here, it is defined that the L & S pattern has a line (liner pattern) size of 100 nm and a space size (an interval between adjacent linear patterns) of 100 nm.

Figure 4:
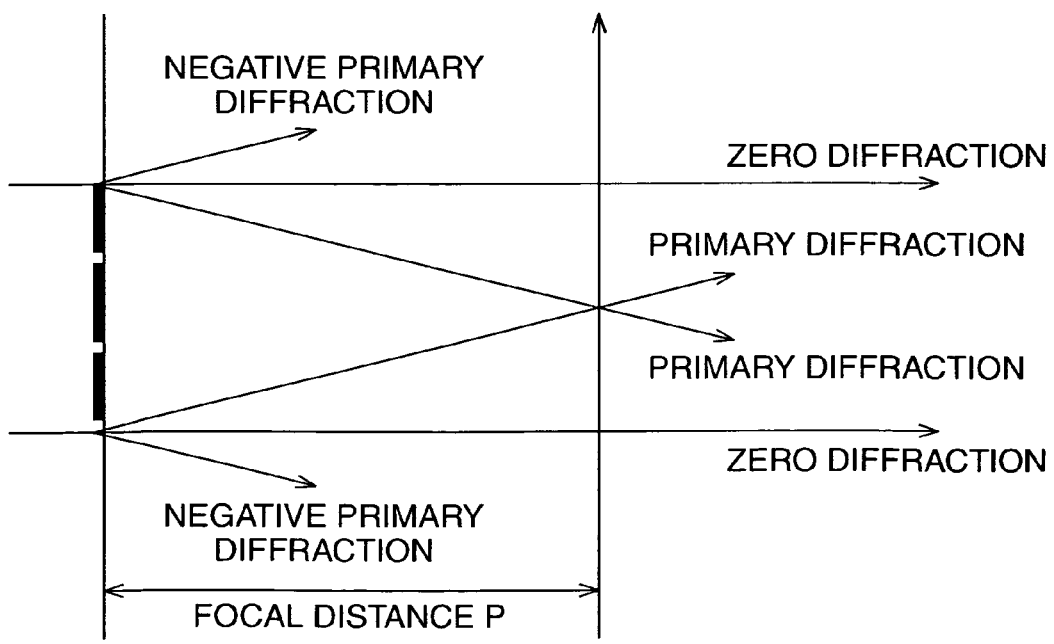
FIG. 4 is a schematic view showing a state of optical diffraction in a Fresnel zone pattern.

As shown in FIG. 4, the exposure light passed through the transparent portion of the first mask pattern 21 has the largest exposure-dose amount at a position being 1000 nm distant from the photomask face backed by diffraction (here, primary diffraction is dominant) and has smaller exposure-dose amount as the distance thereto becomes larger. In the first mask pattern 21 being the Fresnel zone pattern, the exposure-dose amount to the transfer object varies depending on the focus variation of the exposure system. Specifically, at the time of the exposure using the test photomask 11, as the focus position of the exposure system shifts and comes close to the light condensed position of the first mask pattern 21, the diffracted light from the first mask pattern 21 to the second mask pattern 22 is irradiated stronger. Accordingly, in this case, the resist pattern after development being the transferred pattern of the second mask pattern 22 increases in size.

When the L & S pattern is used as a second mask pattern 22 for size measurement, the size variation of the resist pattern caused by the focus variation is extremely small when the first mask pattern is not provided. With the provision of the first mask pattern 21, the size varies largely caused by the focus variation. Therefore, in other words, the focus variation can be recognized with extremely high sensitivity.

Figure 5:
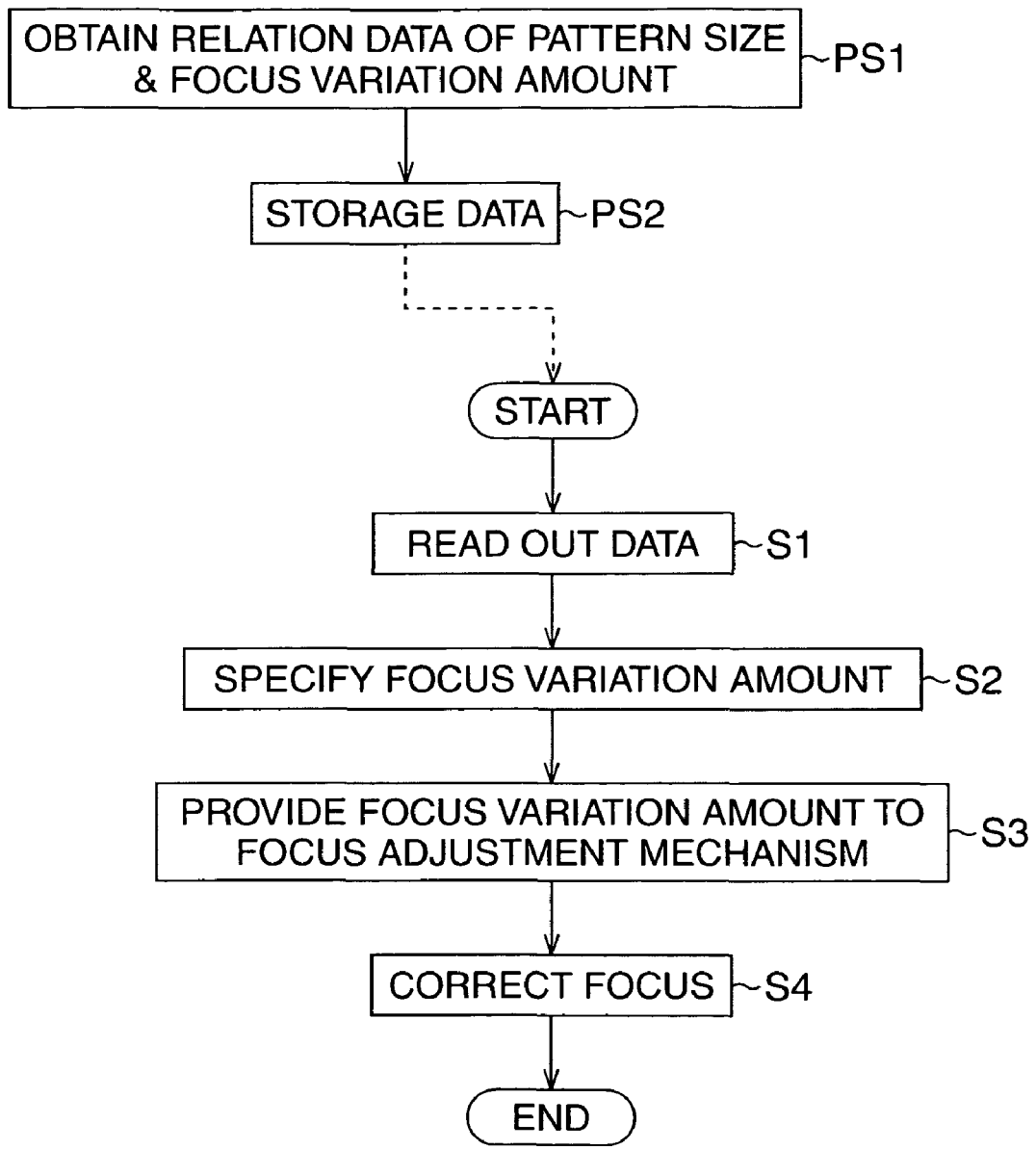
FIG. 5 is a flowchart showing a focus measurement and correction method according to the first embodiment.

FIG. 5 is a flowchart showing a focus measurement and correction method according to the present embodiment.

In the present embodiment, first, the exposure is performed to the first and second mask patterns 21, 22 using the test photomask 11 by assigning plural values to the focus variation amount to obtain data showing the relation between the size of the resist pattern being the transferred pattern of the second mask pattern 22 and the focus variation amount in advance (prestep PS1).

Figure 6:
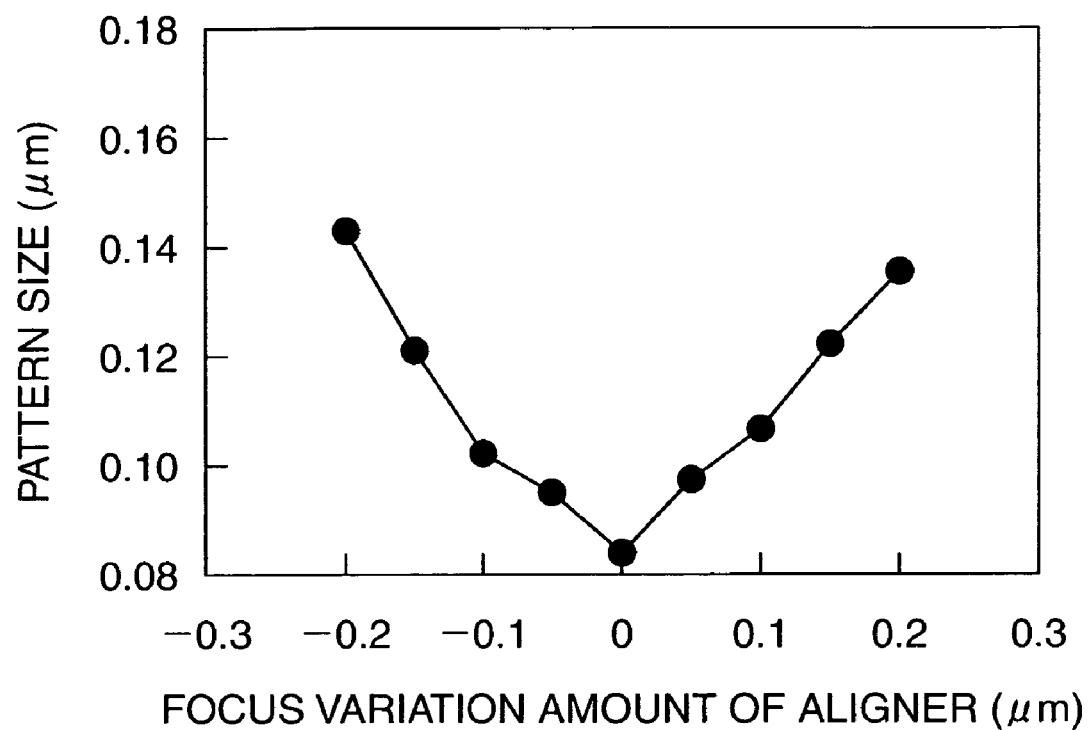
FIG. 6 is a characteristic view showing a relation between sizes of a resist pattern and focus variation amounts in the first embodiment.

As one example of this data, a characteristic view showing the relation between the size of the resist pattern and the focus variation amount is shown in FIG. 6.

As shown in the drawing, in the state having no focus variation (state in focus), the measured size value indicates the minimum, in which the larger the focus variation amount is, the exposed portion of the second mask pattern 22 comes close to the light condensed position of the first mask pattern 21 and the diffracted light from the first mask pattern 21 is irradiated to the exposed portion of the second mask pattern 22 stronger, so that the measured size increases. This data is stored in the memory section 14 (prestep PS2).

The focus measurement of the exposure system is performed on the assumption that presteps PS1, PS2 are completed.

First, the focus variation specifying section 13 reads out the data in FIG. 6 from the memory section 14 (step S1).

Subsequently, the focus variation specifying section 13 performs the exposure by the exposure system using the test photomask 11 and checks the measured size of the resist pattern with the data read out from the memory section 14 to specify the focus variation amount of the exposure system (step S2).

Note that the size of the resist pattern is measured, for example, by a scanning electron microscope (SEM). In the present embodiment, the focus variation amount of the exposure system can be specified easily and precisely by the single exposure using the test photo mask 11.

On the assumption that the above-described presteps PS1, PS2 are included, the focus measurement method according to the present invention is composed of the steps S1, S2. The respective steps described below are those correcting the specified focus variation amount.

The focus correction section 15 provides the focus adjustment mechanism 12 the information about the focus variation amount to correct the focus variation specified in the focus variation specifying section 13 (step S3). The focus adjustment mechanism 12 received the information on the focus variation amount adjusts the position of the wafer stage 5 so as to correct the focus variation, so that the exposure light from the projection optical system 4 is focused (step S4).

As described above, according to the present embodiment, the position in focus, namely the best focused position, can be obtained easily and surely by the single exposure with high precision, allowing the highly-precise focus measurement in the extremely short period of time, so that the highly-reliable patterning can be performed speedy.

MODIFICATION EXAMPLE

Hereinafter, the description will be given of a modification example of the first embodiment. Here, for the same components and the like as of the first embodiment, the same numerical references will be used and detail description thereof will be omitted.

Figure 7:
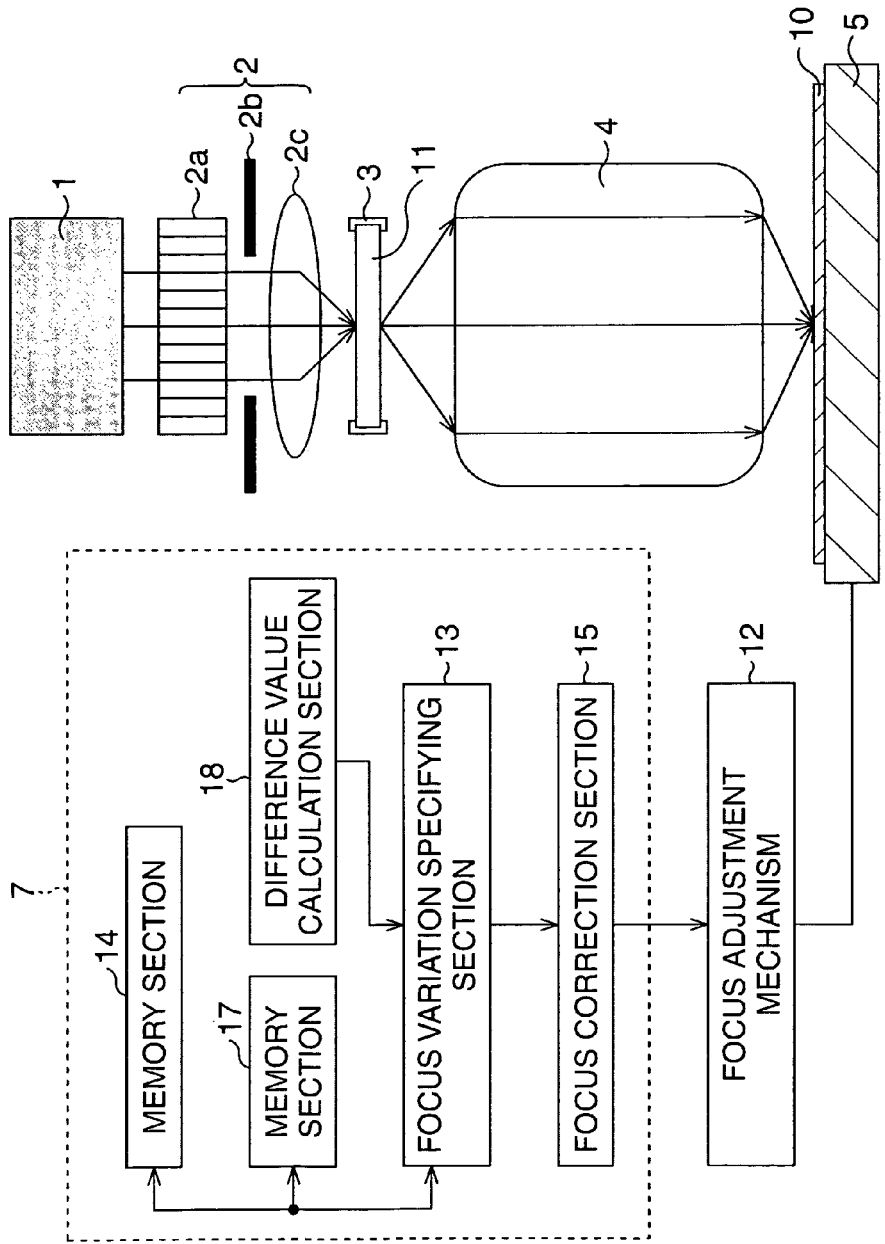
FIG. 7 is a schematic view showing an outline structure of an exposure system according to a modification example of the first embodiment.

FIG. 7 is a schematic view showing an outline structure of an exposure system according to the modification example of the first embodiment.

The exposure system includes the illumination light source 1, the condensing optical system 2, the reticle stage 3, the projection optical system 4, and the wafer stage 5, as in the first embodiment, and further includes a focus control system 7 measuring and correcting the focus variation of exposure light in the transfer object.

The focus control system 7 is composed of a memory section 17 in which the data showing the relation between the size variation amount and the focus variation amount is stored and a difference value calculation section 18 to obtain size variation measurement value in addition to the focus variation specifying section 13 and the focus correction section 15 being the components of the focus control system 6 of the exposure system according to the first embodiment shown in FIG. 1.

In the exposure system in FIG. 7, a test photomask 16 is used in place of the test photomask 11. In the exposure system, the test photomask 16, the focus variation specifying section 13, the memory section 17 and the difference value calculation section 18 composes the focus measurement apparatus according to the present example.

Figure 8:
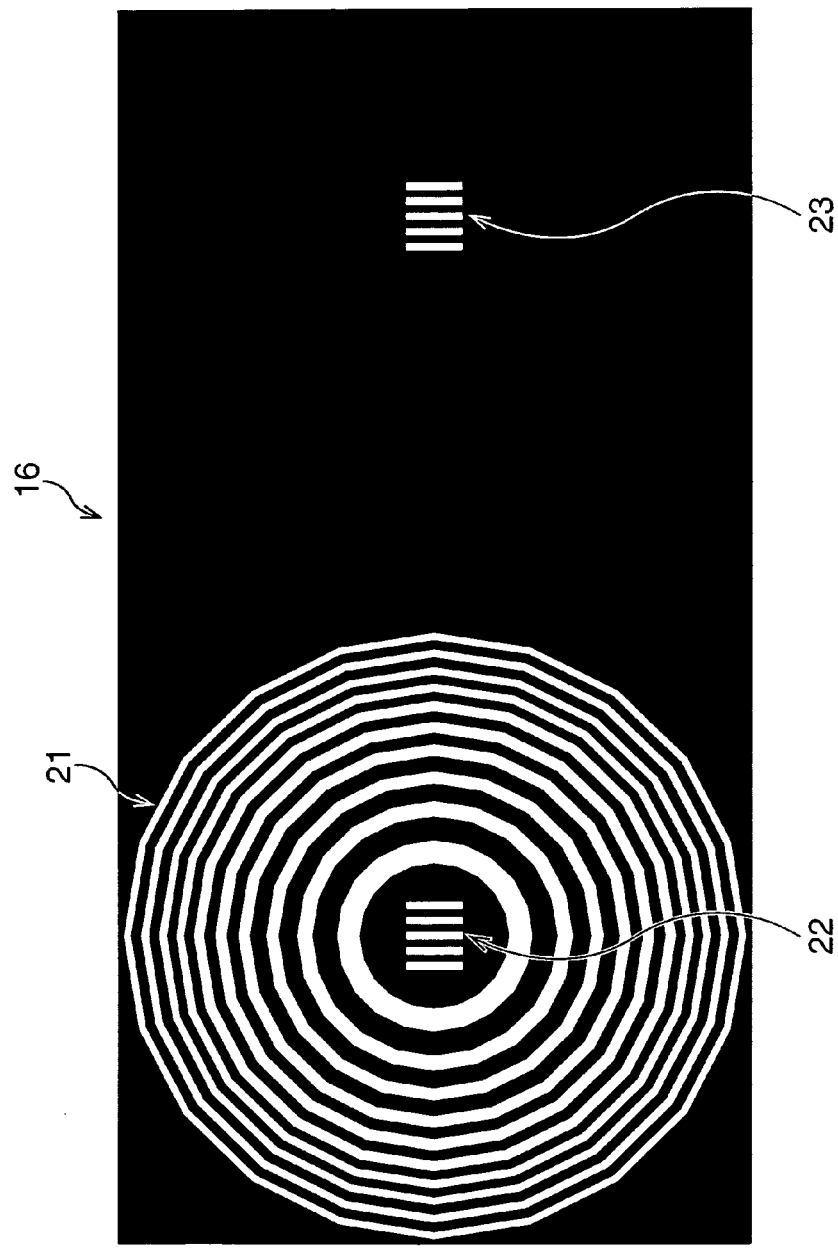
FIG. 8 is a schematic plan view showing a structure of a test photomask according to the modification example of the first embodiment.

As shown in FIG. 8, the test photomask 16 is formed by including a third mask pattern 23 together with the first and second mask patterns 21, 22, in which the third mask pattern being the same pattern as the second mask pattern 22 is formed at a position appropriately distant from the first and second mask patterns 21, 22 (to the extent that they are not affected by the mutual exposures). As will be described below, the test photomask 16 is used to obtain more precise focus variation amount, in which the effect of the exposure light amount variation is eliminated, by taking account of the dose amount of the exposure light (exposure-dose amount:

hereinafter treated in the same manner as the exposure energy in view of meaning) in the transfer object.

Figure 9:
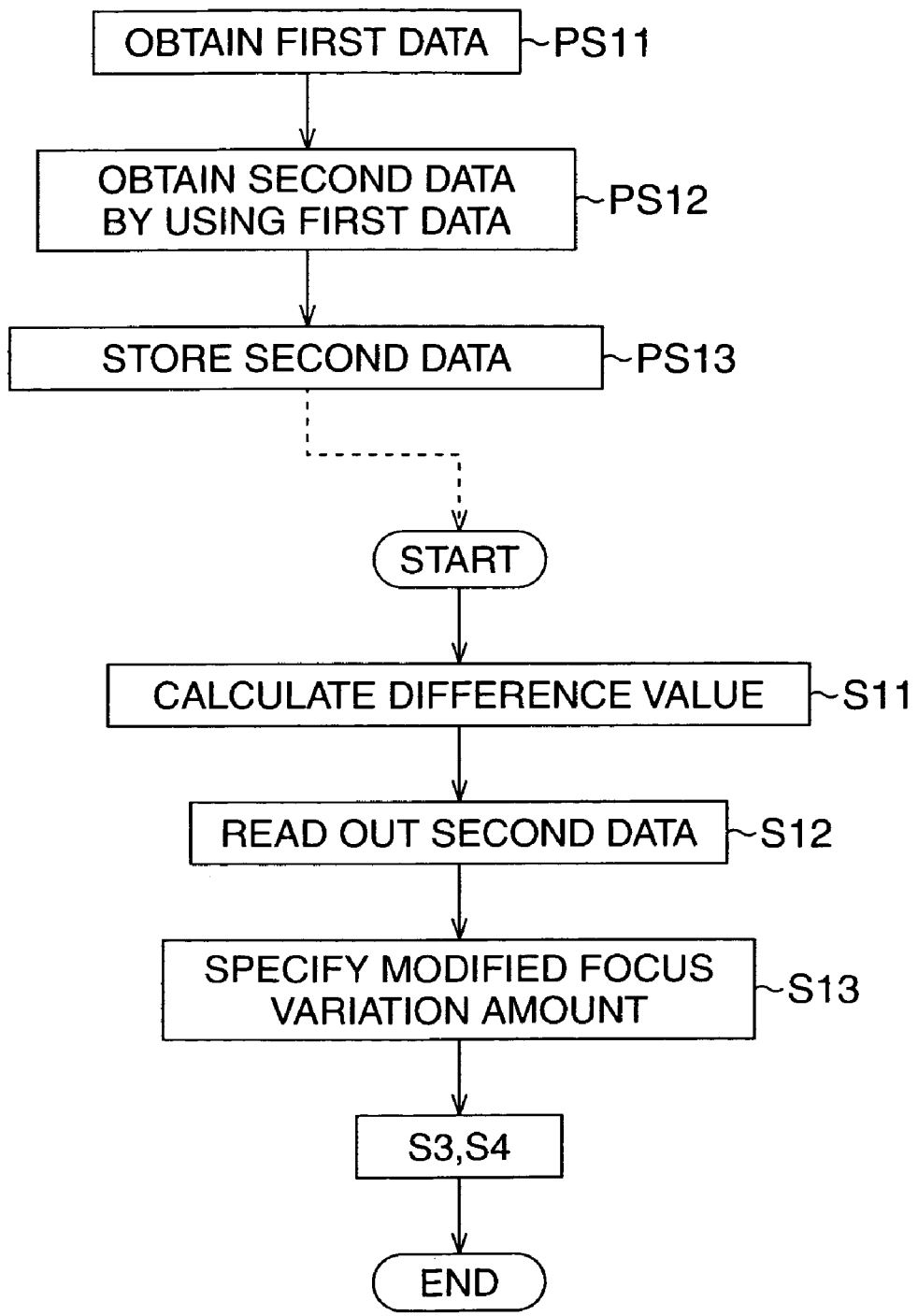
FIG. 9 is a flowchart showing a focus measurement method according to the modification example of the first embodiment.

FIG. 9 is a flowchart showing a focus measurement method according to the modification example of the first embodiment.

In the present example, first, the exposure is performed to the first and second mask patterns 21, 22 using the test photomask 16 by assigning plural values to the focus variation amount to obtain data showing the relation between the size of the resist pattern being the transferred pattern of the second mask pattern 22 and the focus variation amount in advance (prestep PS11). Here, for the purpose of convenience, the data is called first data. As in FIG. 6, in the state having no focus variation (state in focus), the measured size value indicates minimum, in which the measured size amount increases as the focus variation amount increases.

In the first data obtained using the first and second mask patterns 21, 22, the size value of the resist pattern corresponding to the case where the focus variation amount is 0 (zero) (in focus) can be regarded briefly as a value measured in the state not affected by the light irradiation from the first mask pattern 21. Specifically, in the state in focus, the measured size value obtained using the first and second mask patterns 21, 22 is almost the same as the measured size value obtained using the photomask including only the second mask pattern 22 as a mask pattern.

When the exposure is performed using the first and second mask patterns 21, 22, in the state in focus, the measured size value of the second mask pattern 22 is the value affected only by the exposure energy variation.

Meanwhile, as described above, in the case of the L & S pattern, the size variation of the resist pattern due to the focus variation is extremely small. Accordingly, when the photomask including only the second mask pattern 22 being the L & S pattern for size measurement as a mask pattern without including the first mask pattern 21 is used, the relation between the size of the resist pattern and the focus variation amount is depicted by an extremely modest curve, in which the size value scarcely depends on the focus variation amount. Accordingly, when this size value is deemed to be a steady value, the steady value is the same as the measured size value of the second mask pattern 22 in the state in focus where the first and second mask patterns 21, 22 are used.

In the present example, by making use of the above observed result, the first data is corrected in the manner as described below.

Specifically, for the first data obtained by using the first and second mask patterns 21, 22 of the test photomask 16, modified data (second data) obtained by subtracting the size value corresponding to the case in focus from the respective size values corresponding to the respective focus variation amounts is prepared in advance (prestep PS12).

Figure 10:
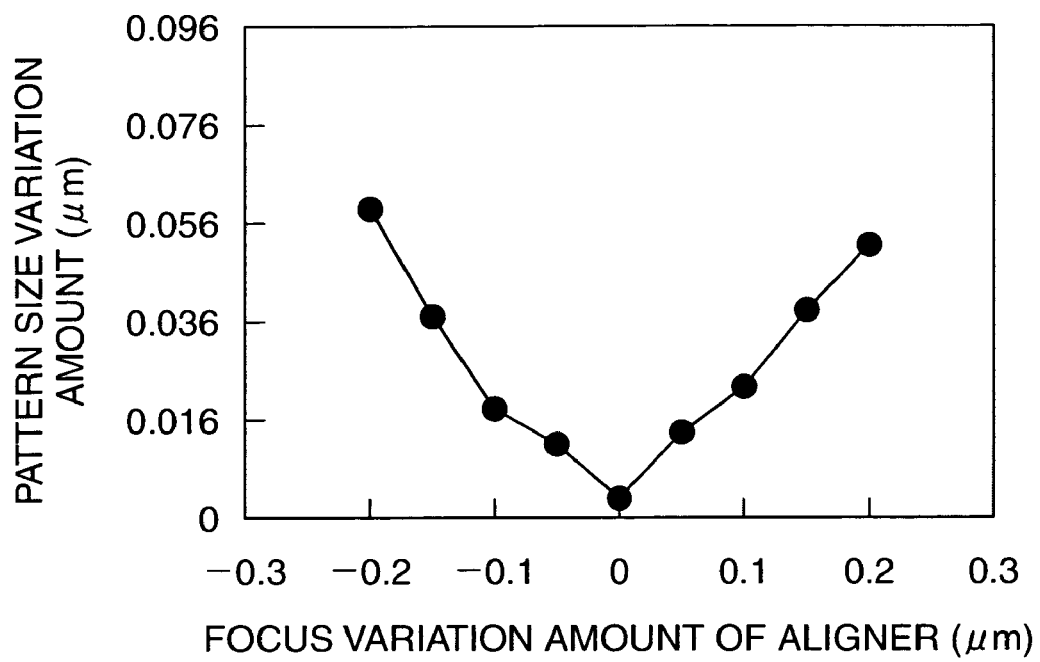
FIG. 10 is a characteristic view showing correction data in the modification example of the first embodiment.

As one example of the second data, a characteristic view obtained by modifying the characteristic view in FIG. 6 in the above-described manner is shown in FIG. 10.

In FIG. 6, for the first data, the size value corresponding to the case in focus (in the case where the focus variation amount is 0 (zero) μm) is 0.084 μm. By subtracting this 0.084 μm from the size values in FIG. 6, the second data in FIG. 10 can be obtained as modified data of the first data.

In the first data, the size value of the resist pattern is slightly affected by the exposure energy variation in addition to the effect by the focus variation. Meanwhile, in the first data, the size value of the resist pattern in the state in focus can be seen as the value affected only by the exposure energy variation in which the effect by the focus variation is eliminated as described above. Accordingly, the second data is the data showing the relation between the size variation value of the resist pattern affected only by the focus variation in which the effect of the exposure energy variation is eliminated and the focus variation amount, for the second mask pattern 22.

The second data is stored in the memory section 17 (prestep PS13).

The focus measurement of the exposure system is performed on the assumption that presteps PS11 to PS13 are in the completed state.

First, the difference value calculation section 18 performs the exposure to the first and second mask patterns 21, 22 and the third mask pattern 23 at once by the exposure system using the test photomask 16, and the difference value is calculated by subtracting the measured size of the resist pattern corresponding to the third mask pattern 23, which is measured in a similar fashion, from the measured size value of the resist pattern corresponding to the second mask pattern 22 (step S1). This difference value is size variation value affected only by the focus variation in which the effect of the exposure energy variation is eliminated. Note that the sizes of the respective resist patterns are measured, for example, by using the scanning electron microscope (SEM).

Subsequently, the focus variation specifying section 13 reads out the second data from the memory section 17 (step S12).

Subsequently, the focus variation specifying section 13 checks the above-described difference value with the second data read out from the memory section 17 to specify a modified focus variation amount of the exposure system (step S13). This modified focus variation amount is the focus variation amount with higher precision (purity) in which the effect of the exposure energy variation is eliminated. In other words, the focus variation amount of the exposure system can be specified easily and extremely precisely by the single exposure using the test photo mask 16.

After that, in the same manner as in the first embodiment, the focus variation of the exposure system is corrected by steps S3, S4.

As described above, according to the present example, the position in focus, namely the best focused position, can be obtained easily and surely by the single exposure with extreme high precision, allowing the highly-precise focus measurement in the extremely short period of time, so that the highly-reliable patterning can be performed speedy.

Second Embodiment

Next, the description will be given of a second embodiment. Here, for the same components and the like as of the first embodiment, the same numerical references will be used and detail description thereof will be omitted.

The present embodiment is to measure and correct the focus variation of the exposure light for the exposure system having the same structure as in the first embodiment, in which, however, the test photomask has a different structure. Here, plural (for example, two) pieces of test photomasks are used to perform multiple (double) exposures.

Along with increasing density in semiconductor elements, the microfabrication of the patterns formed by lithography is showing progress. As a method of forming a micropattern with high precision, a multiple exposure process using a Levenson type phase shift mask is proposed.

A method of the multiple exposure process will be described using FIGS. 11A to 11C.

For example, a case where the multiple exposure process is applied to form a gate layer on a silicon substrate, here a gate wiring is formed in an element isolation region, and a gate electrode narrower than the gate wiring in an active region, in an integrated manner, will be shown as an example.

Figure 11C:
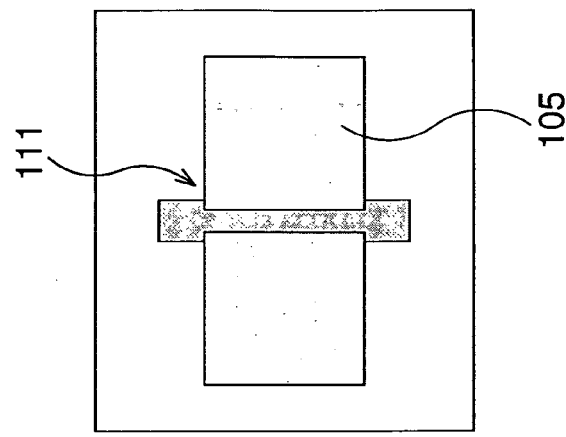
FIGS. 11A to 11C are schematic plan views to explain a double exposure employed in a second embodiment.
Figure 11A:
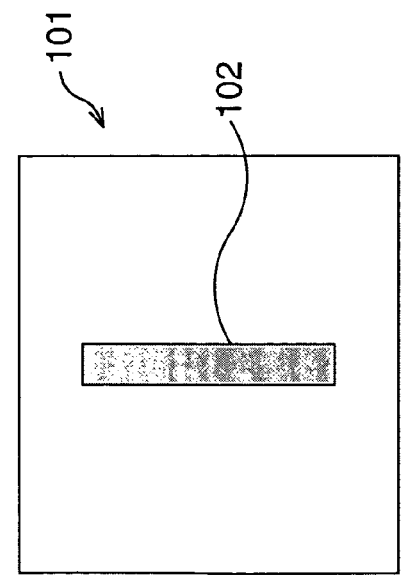

As shown in FIG. 11A, a first photomask 101 is a general binary mask, halftone phase shift mask, or the like.

Figure 11B:
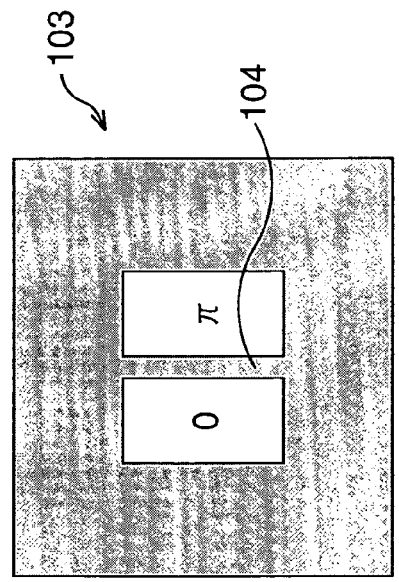

As shown in FIG. 11B, a second photomask 103 is the Levenson type phase shift mask; the Levenson type phase shift mask is structured to have a phase shift by π(180°) at right and left of the mask pattern (between adjacent mask patterns). When the exposure is performed using the Levenson type phase shift mask, the light is intensified sharply, and the use of a relatively small illumination system allows obtaining an extremely wide depth of focus.

In order to perform the double exposure using the first and second photomasks 101, 103, first, a second mask pattern 104 is exposed onto a photoresist (not shown) of the silicon substrate using the second photomask 103. After that, a first mask pattern 102 is exposed (doubly exposed) onto the photoresist using the first photomask 101 in a manner overlapping the second mask pattern 104.

As a result, as shown in FIG. 11C, a gate 111 having narrower width is formed only on an active region 105. Thus, when the gate layer is formed by the double (multiple) exposures, extremely wide exposure margin can be obtained as compared to the single exposure.

As shown in FIG. 12. a test photomask 31 according to the present embodiment is composed of a first photomask 32 being a Levenson Type phase shift mask and including a first mask pattern 21 only formed thereon as a mask pattern, and a second photomask 33 being a general binary mask, a halftone phase shift mask or the like and including a second mask pattern 22 only formed thereon as a mask pattern, which are paired. A state of the transferred pattern formed by the double exposure using the first photomask 32 and the second photomask 33 is shown on the right side in FIG. 12.

In the exposure system according to the present embodiment, the test photomask 31, the focus variation specifying section 13 and the memory section 14 compose the focus measurement apparatus.

Figure 13:
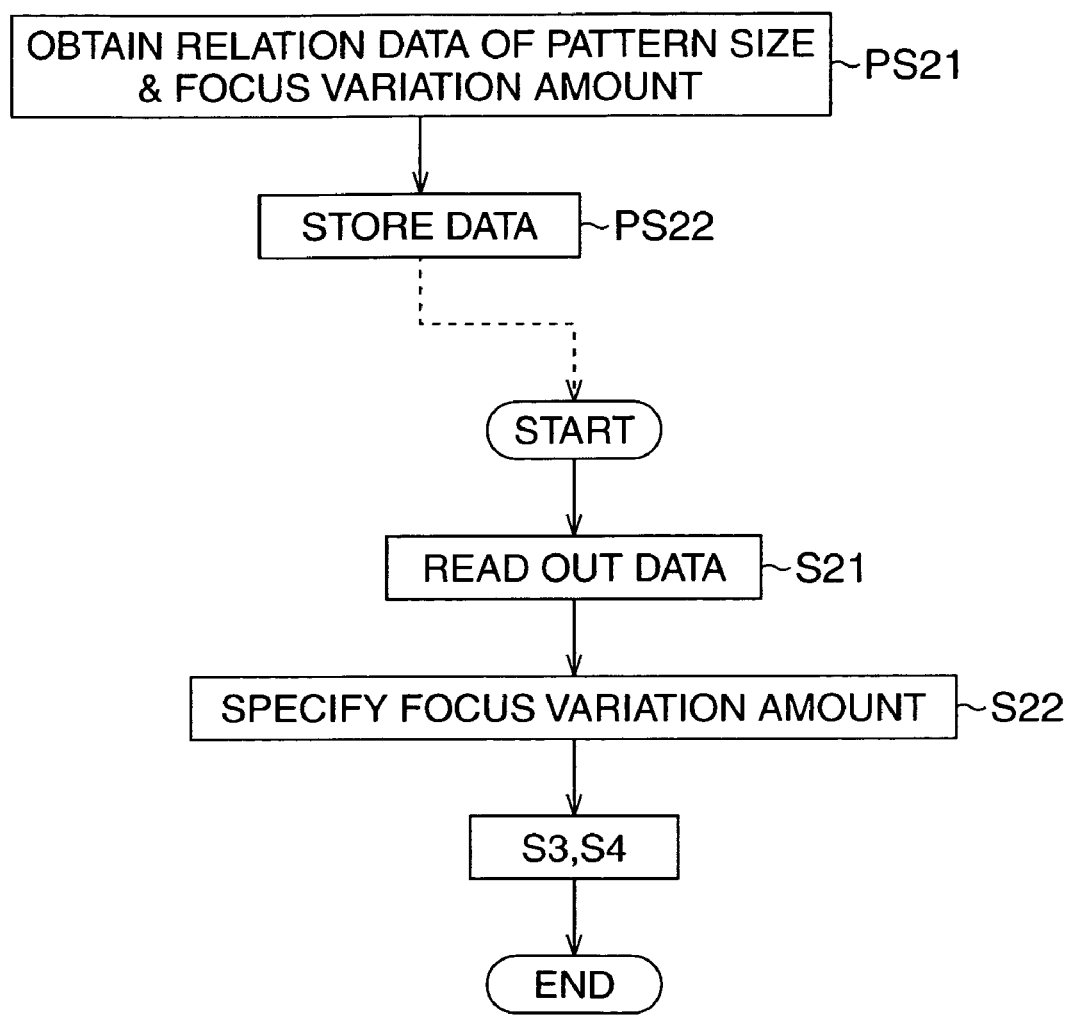
FIG. 13 is a flowchart showing a focus measurement method according to the second embodiment.

FIG. 13 is a flowchart showing a focus measurement method according to the present embodiment.

In the present embodiment, first, an exposure is performed to the second mask pattern 22 using the second photomask 33 out of the test photomask 31 by the illumination light source 1 set to have a numerical aperture (NA) of 0.92, σ.0.30. Subsequently, the exposure is performed to the first mask pattern 21 using the first photomask 32 by assigning plural values to the focus variation amount by the illumination light source 1 set to have 0.92, ½ zone illumination (external σ.0.95). In this manner, the data shoring the relation between the size of the resist pattern being the transferred pattern of the second mask pattern 22 and the focus variation amount is obtained in advance (prestep PS21).

Figure 14:
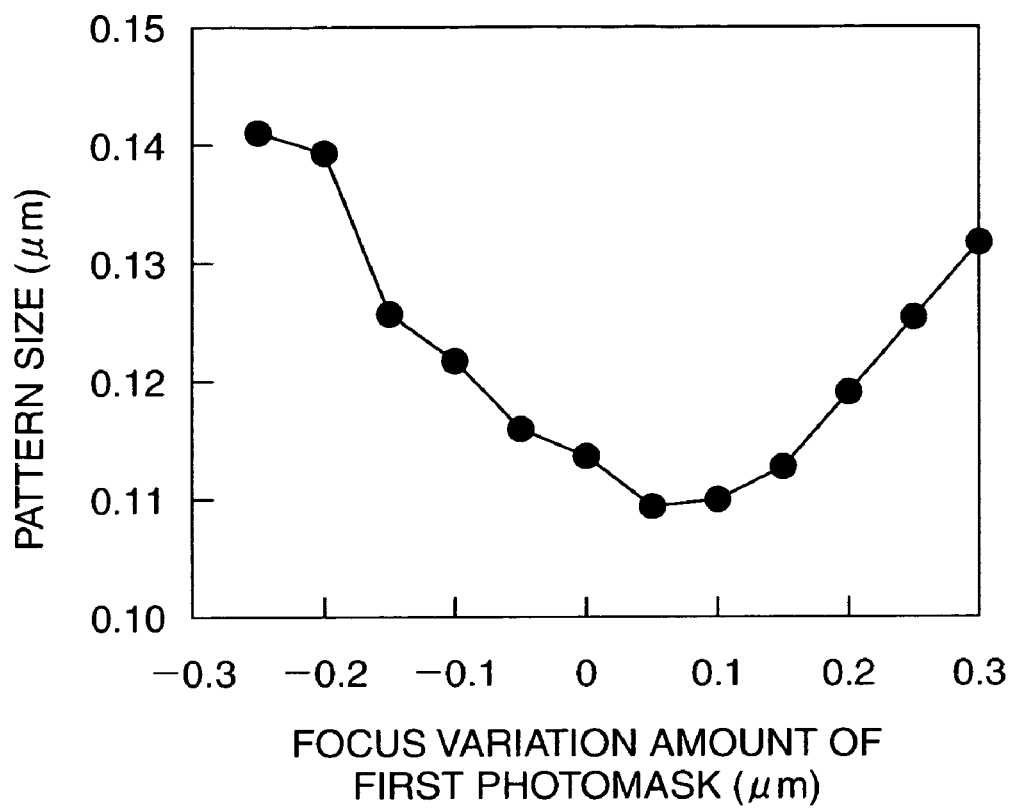
FIG. 14 is a characteristic view showing a relation between sizes of the resist pattern and focus variation amounts in the second embodiment.

As one example of this data, a characteristic view showing the relation between the size of the resist pattern and the focus variation amount is shown in FIG. 14.

As shown in the drawing, in the state having no focus variation (state in focus), the measured size value indicates the minimum, in which as the focus variation amount increases, the exposed portion of the second mask pattern 22 comes close to the light condensed position of the first mask pattern 21 and the diffracted light irradiated from the first mask pattern 21 to the exposed portion of the second mask pattern 22 exposed by the second photomask 33 becomes stronger, so that the measured size increases. This data is stored in the memory section 14 as above (prestep PS22).

On the assumption that presteps P21, P22 are completed, the focus variation amount of the exposure system is recognized.

First, the focus variation specifying section 13 reads out the data in FIG. 14 from the memory section 14 (step S21).

Subsequently, the focus variation specifying section 13 performs the exposure (the state after the double exposure is shown on the right in FIG. 12) using the first and second photomasks 32, 33 of the test photomask 31, respectively, in the exposure system, and the measured size value of the resist pattern is checked with the data read out from the memory section 14 to specify the focus variation amount of the exposure system (step S22).

Note that the size of the resist pattern is measured, for example, by the scanning electron microscope (SEM). In the present embodiment, by the two-time exposures using the test photomask 31, 32, respectively of the test photomask 31, namely by the double exposure using the test photomask 31, the focus variation amount of the exposure system can be specified easily and precisely.

After that, in the same manner as in the first embodiment, the focus variation of the exposure system is corrected by steps S3, S4.

As described above, according to the present embodiment, the position in focus, namely the best focused position, can be obtained easily and surely by the double exposure with extreme high precision, allowing the highly-precise focus measurement in the extremely short period of time, so that the highly-reliable patterning can be performed speedy.

Third Embodiment

Next, the description will be given of a third embodiment. Here, for the same components and the like as of the first embodiment, the same numerical references will be used and detail description thereof will be omitted.

In the present embodiment, the film thickness of the resist film, which is exposed and developed, will be measured to specify the focus variation amount.

Figure 15:
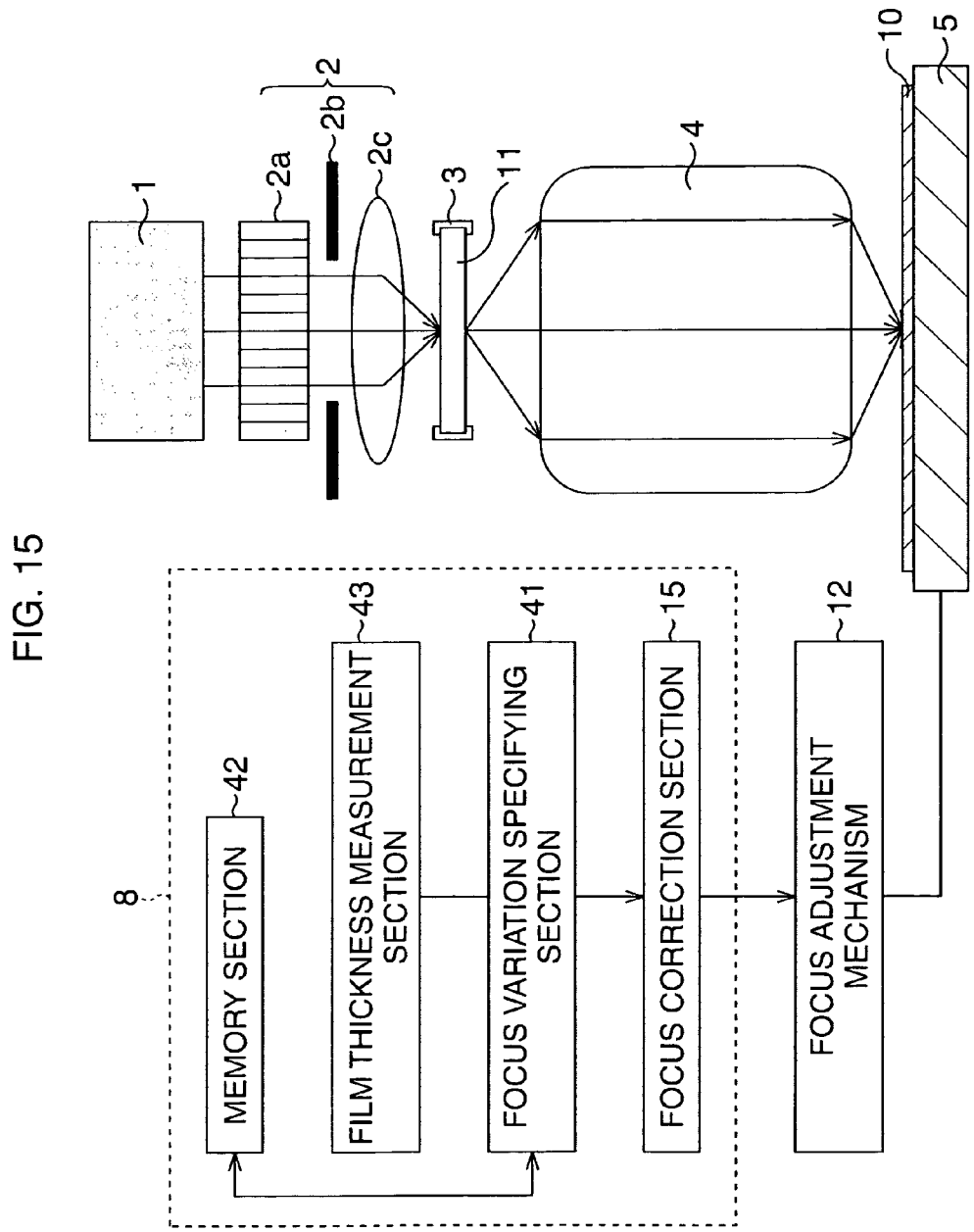
FIG. 15 is a schematic view showing an outline structure of an exposure system according to a third embodiment.

FIG. 15 is a schematic view showing an outline structure of an exposure system according to a third embodiment.

The exposure system includes an illumination light source 1, the condensing optical system 2, the reticle stage 3, the projection optical system 4, and the wafer stage 5, as in the first embodiment, and further includes a focus control system 8 measuring and correcting the focus variation of the exposure light in the transfer object.

The focus control system 8 is composed of a focus variation specifying section 41 specifying the focus variation amount of the exposure light in the resist film being the transfer object for the exposure system, a memory section 42 used in the focus variation specifying section 41 and storing data showing the relation between the film thickness of the resist film and the focus variation amount, a film thickness measurement section 43 measuring the film thickness of the resist film, and a focus correction section 15 instructing the focus adjustment mechanism 12 to correct the focal point based on the measurement by the focus variation specifying section 41.

As a film thickness measurement section 43, for example, one that irradiates a laser beam to the resist film and detects variation in interference-light intensity along with processing time to thereby calculate the film thickness based on frequency component of the waveform can be cited.

In the exposure system according to the present embodiment, the test photomask 51, the focus variation specifying section 41, the memory section 42 and the film thickness measurement section 43 compose the focus measurement apparatus.

Figure 16:
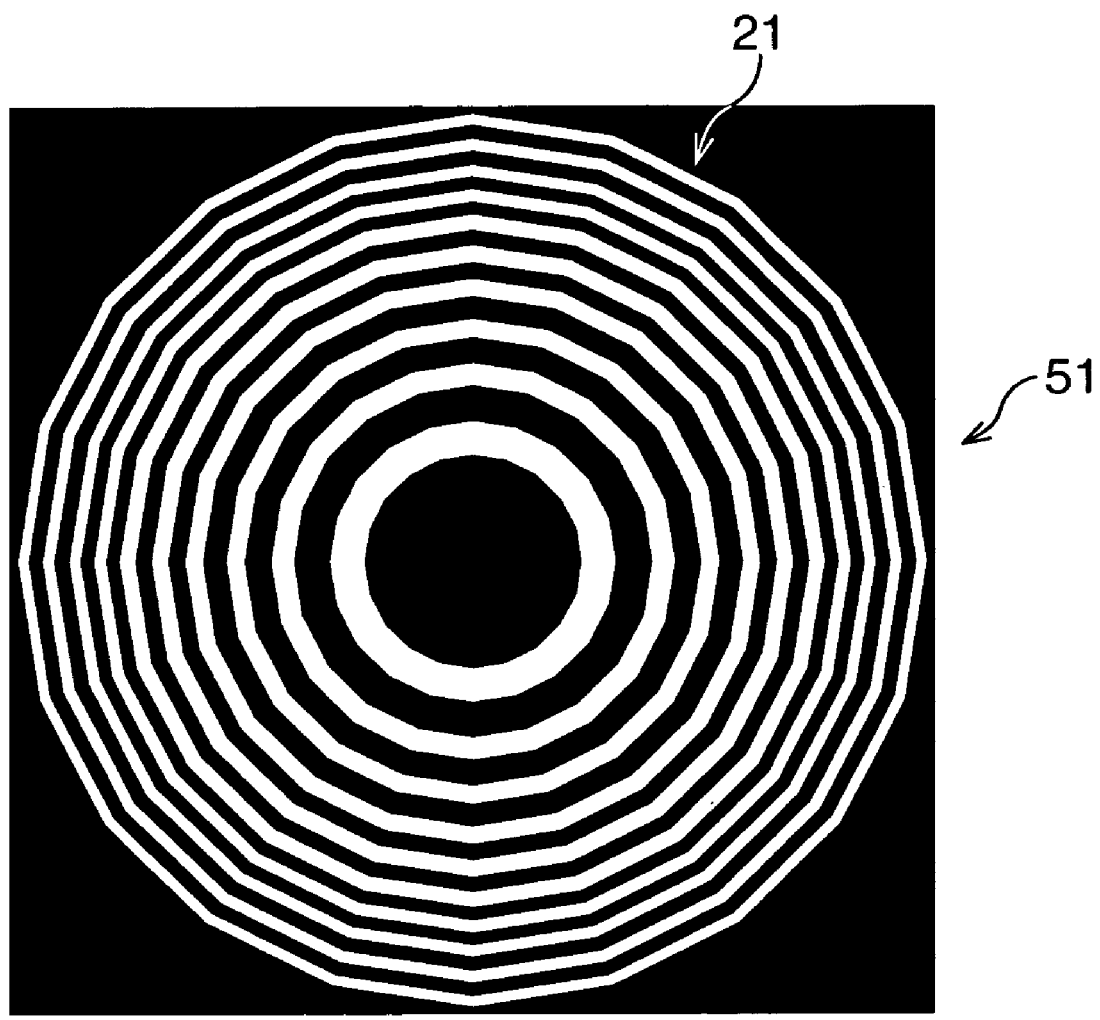
FIG. 16 is a schematic plan view showing a structure of a test photomask according to the third embodiment.

As shown in FIG. 16, a test photomask 51 has only the first mask pattern 21 formed thereon as a mask pattern.

The present invention makes use of the facts that the exposure-dose amount to the resist film from the Fresnel zone pattern depends on the focus variation and that the film thickness of the resist film after the development process depends on the exposure-dose amount.

Figure 17:
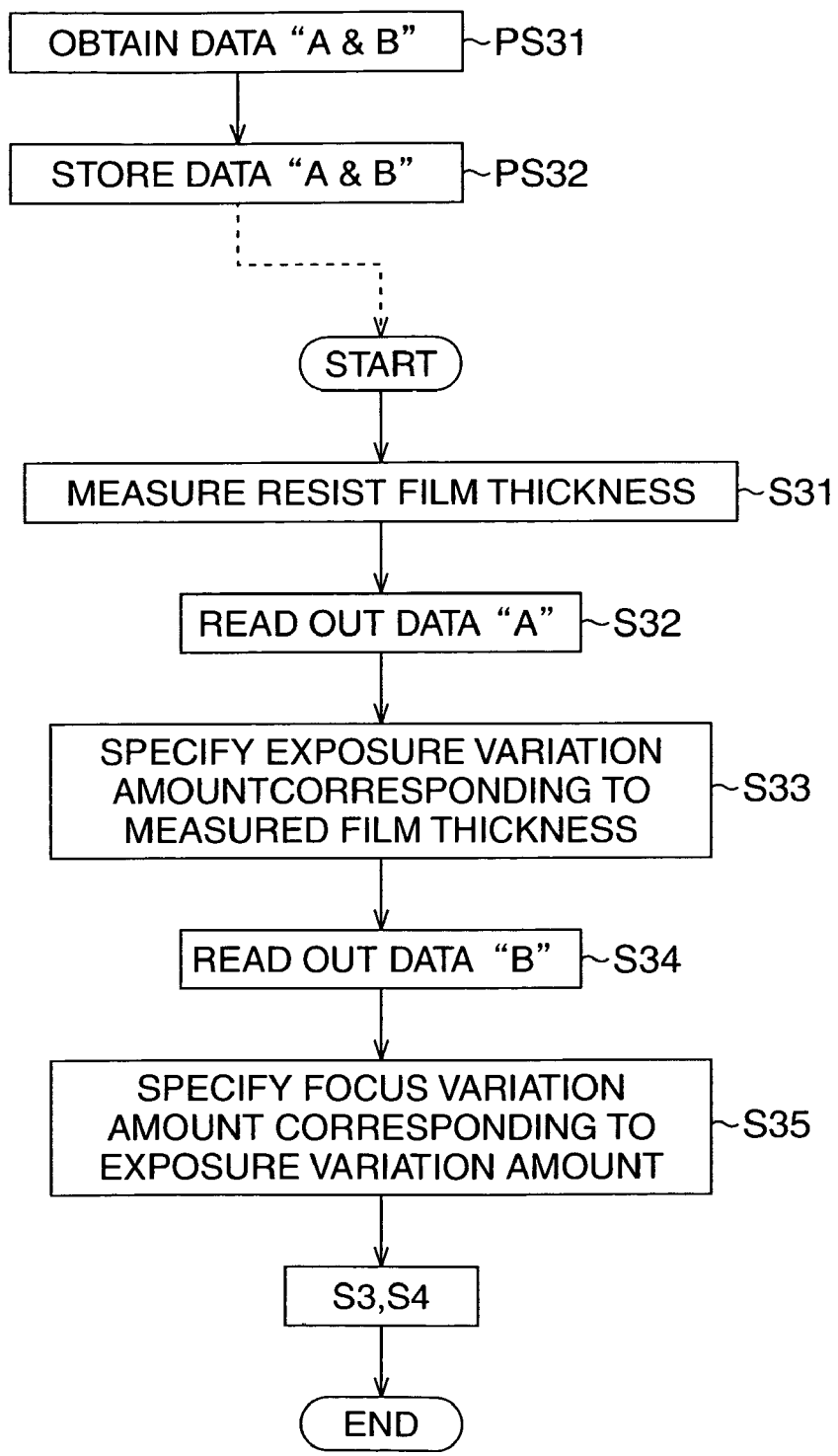
FIG. 17 is a flowchart showing a focus measurement method according to the third embodiment.

FIG. 17 is a flowchart showing a focus measurement method according to the present embodiment.

In the present embodiment, first, the exposure is performed to the first mask pattern 21 using the test photomask 51 by assigning plural values to the focus variation amount, and data showing the relation between the film thickness of the resist film after the development and the focus variation amount is obtained in advance (prestep SP31). The film thickness of the resist film is measured by using the film thickness measurement section 43.

Here, for example, for the purpose of convenience of obtaining the data, the data showing the relation between the film thickness of the resist film and the focus variation amount is prepared by obtaining the data with respect to the relation between the film thickness of the resist film and the exposure-dose amount and the relation between the exposure-dose amount and the focus variation amount, respectively, and by combining them. For the purpose of convenience of explanation, the data showing the relation between the film thickness of the resist film and the exposure-dose amount and the data showing the relation between the exposure-dose amount and the focus variation amount are defined as data A and data B, respectively.

In the present embodiment, the data A and data B are stored in the memory section 42, respectively (prestep PS32).

Figure 18:
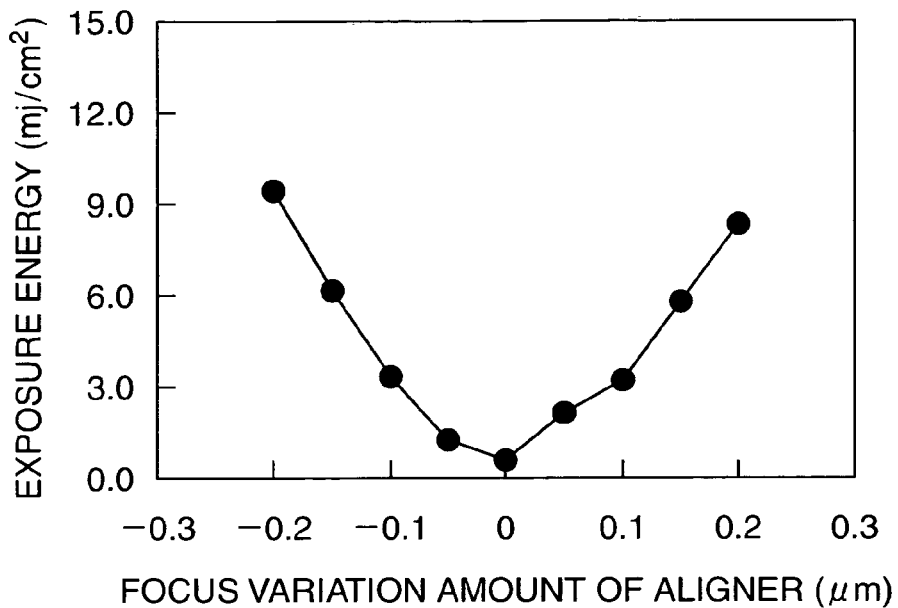
FIG. 18 is a characteristic view showing a relation between film thicknesses of the resist film and the exposure-dose amounts in the third embodiment.
Figure 19:
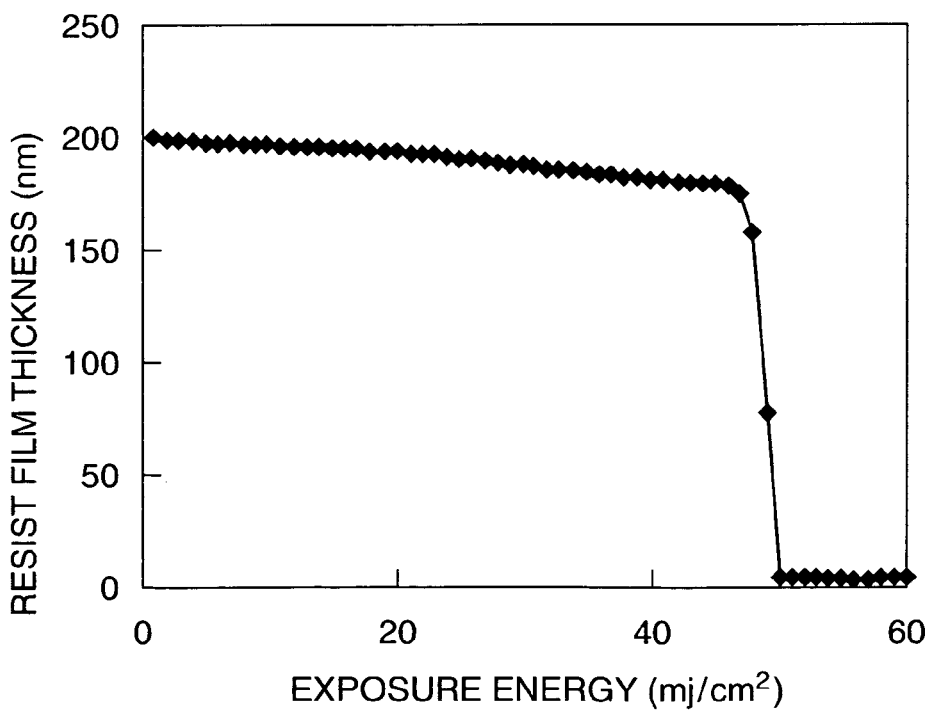
FIG. 19 is a characteristic view showing a relation between the exposure-dose amounts and the focus variation amounts in the third embodiment.

For the data A, a characteristic view showing the relation between the film thickness of the resist film and the exposure-dose amount is shown in FIG. 18 and, for the data B, a characteristic view showing the relation between the exposure-dose amount and the focus variation amount is shown in FIG. 19, respectively.

The focus measurement of the exposure system is performed on the assumption that presteps PS31, PS32 are in the completed state.

First, the first mask pattern 21 of the test photomask 51 is exposed and the film thickness of the resist film after the development is measured by the film thickness measurement section 43 (step S31).

Subsequently, the focus variation specifying section 41 reads out the data A from the memory section 42 (step S32).

Subsequently, the focus variation specifying section 41 checks the measured film thickness value of the resist film with the data A read out from the memory section 42 (step S33). By this check, the exposure-dose amount corresponding to the measured film thickness value is specified.

Subsequently, the focus variation specifying section 41 reads out the data B from the memory section 42 (step S34).

Subsequently, the focus variation specifying section 41 checks the specified exposure-dose amount with the data B read out from the memory section 42 (step S35). By this check, the focus variation amount corresponding to the exposure-dose amount is specified.

After that, in the same manner as in the first embodiment, the focus variation of the exposure system is corrected by steps S3, S4.

As described above, according to the present embodiment, the position in focus, namely the best focused position, can be obtained easily and surely by the single exposure with extreme high precision, allowing the highly-precise focus measurement in the extremely short period of time, so that the highly-reliable patterning can be performed speedy.

Fourth Embodiment

Next, the description will be given of a fourth embodiment. Here, for the same components and the like as of the third embodiment, the same numerical references will be used and detail description thereof will be omitted.

In the present embodiment, the exposure-dose amount of the exposure system is measured to specify and the focus variation amount.

Figure 20:
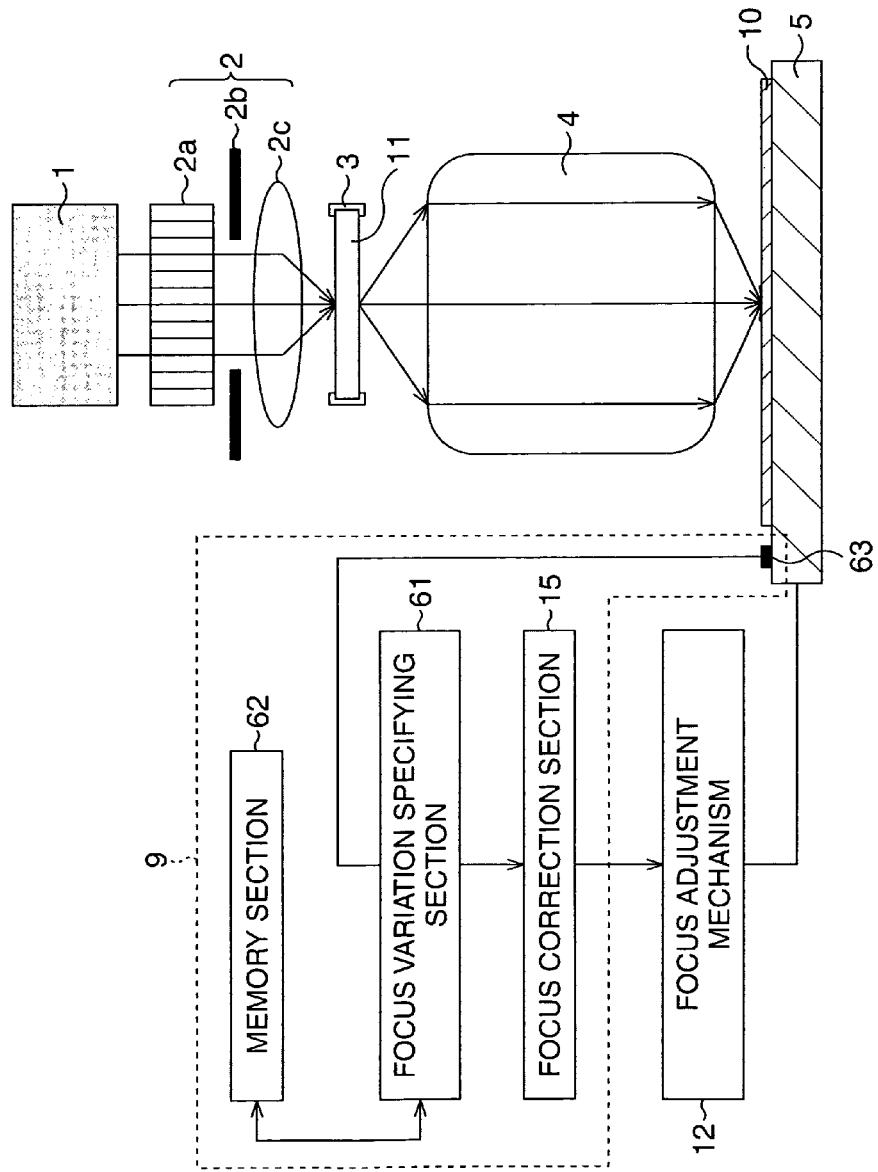
FIG. 20 is a schematic view showing an outline structure of an exposure system according to a fourth embodiment.

FIG. 20 is a schematic view showing an outline structure of an exposure system according to the fourth embodiment.

The exposure system is composed of the illumination light source 1, the condensing optical system 2, the reticle stage 3, the projection optical system 4, and the wafer stage 5, as in the first embodiment, and further composed of a focus control system 9 measuring and correcting the focus variation of exposure light in the transfer object.

The focus control system 9 is composed of a focus variation specifying section 61 specifying the focus variation amount of the exposure light for the exposure system, a memory section 62 used in the focus variation specifying section 61 and storing data showing the relation between the exposure-dose amount and the focus variation amount, an illumination sensor 63 measuring the exposure-dose amount, and the focus correction section 15 instructing the focus adjustment mechanism 12 to correct the focal point based on the measurement by the focus variation specifying section 61.

The illumination sensor 63 is composed, for example, of a photosensor and to detect illumination (exposure energy) of the exposure light irradiated to the surface of the semiconductor wafer from the illumination light source 1.

In the exposure system according to the present embodiment, the test photomask 51, the focus variation specifying section 61, the memory section 62 and the illumination sensor 63 compose the focus measurement apparatus.

As described in the third embodiment, the test photomask 51 has only the first mask pattern 21 formed thereon as a mask pattern.

The present invention makes use of the fact that the exposure-dose amount from the Fresnel zone pattern to the resist film depends on the focus variation.

Figure 21:
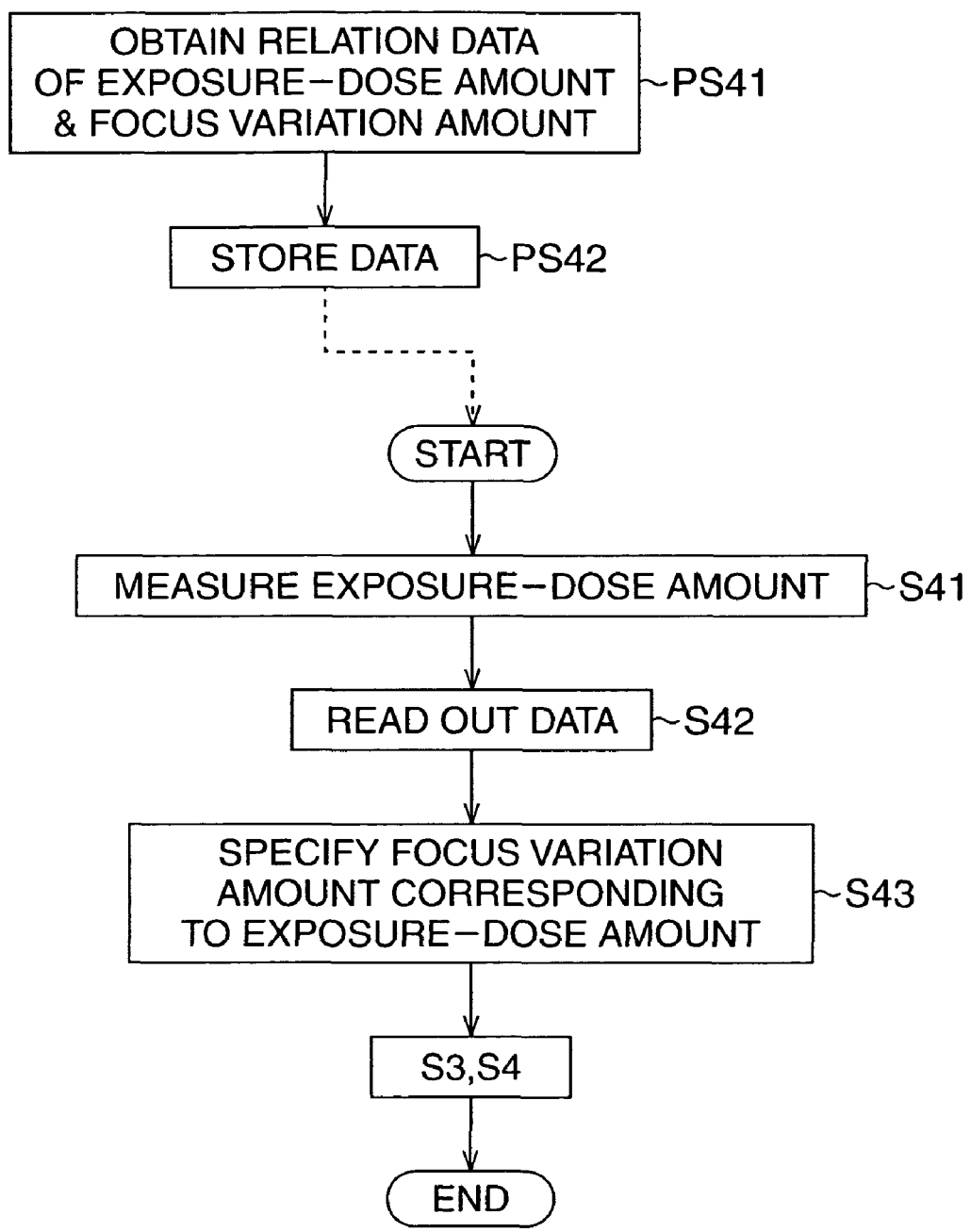
FIG. 21 is a flowchart showing a focus measurement method according to the fourth embodiment.

FIG. 21 is a flowchart showing a focus measurement method according to the present embodiment.

In the present embodiment, first, the exposure is performed to the first mask pattern 21 using the test photomask 51 by assigning plural values to the focus variation amount, and data showing the relation between the exposure-dose amount (exposure energy) and the focus variation amount is obtained in advance (prestep SP41). The exposure-dose amount is measured by using the illumination sensor 63.

For the data, the relation between the exposure-dose amount and the focus variation amount comes to that in FIG. 18 shown in the third embodiment, as an example.

In the present embodiment, the data is stored in the memory section 62 (prestep PS42).

The focus measurement of the exposure system is performed on the assumption that presteps PS41, PS42 are in the completed state.

First, the illumination sensor 63 measures the exposure-dose amount of the diffracted exposure light from the first mask pattern 21 of the test photomask 51. In the present embodiment, the focus variation measurement does not require actual exposure to the resist film.

Subsequently, the focus variation specifying section 61 reads out the data from the memory section 62 (step S42).

Subsequently, the focus variation specifying section 61 checks the measured exposure-dose amount with the data read out from the memory section 62 (step S43). By this check, the focus variation amount corresponding to the measured value of the exposure-dose amount is specified.

After that, in the same manner as in the first embodiment, the focus variation of the exposure system is corrected by steps S3, S4.

As described above, according to the present embodiment, the position in focus, namely the best focused position, can be obtained easily and surely by the single exposure with extreme high precision, allowing the highly-precise focus measurement in the extremely short period of time, so that the highly-reliable patterning can be performed speedy.

Fifth Embodiment

Next, the description will be given of a fifth embodiment. Here, for the same components and the like as of the first embodiment, the same numerical references will be used and detail description thereof will be omitted.

In the present embodiment, an exposure system similar to the first embodiment and a focus measurement and correction method using the exposure system will be disclosed, in which, however, the test photomask has a different structure.

In the exposure system according to the present embodiment, a test photomask 71, the focus variation specifying section 13 and the memory section 14 compose the focus measurement apparatus.

Figure 22:
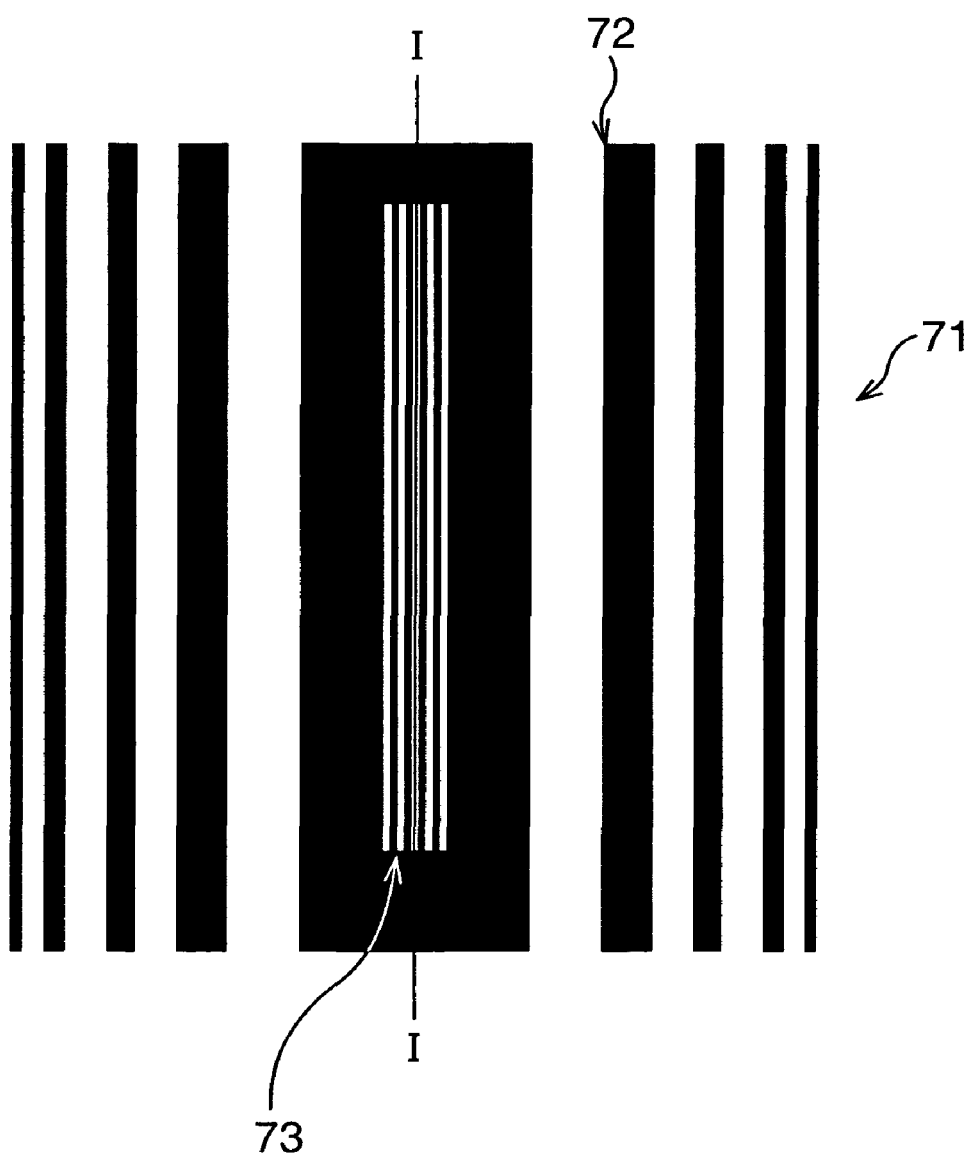
FIG. 22 is a schematic plan view showing a structure of a test photomask according to a fifth embodiment.

As shown in FIG. 22, the test photomask 71 is a pattern with the light condensing effect and a nature that the exposure-dose amount thereof to the transfer object varies in dependence on the focus variation, on which a first mask pattern 72 being a one-dimensional Fresnel pattern is formed here. The one-dimensional Fresnel pattern is a pattern in which opened slits being linear transparent portions are aligned in parallel so as to satisfy an equation (2), in which the transparent portion and non-transparent portion are repeated alternately.

In FIG. 22, the distance between a center line I-I of the one-dimensional Fresnel pattern and the opened slit is expressed by the equation (2) below.

$$Dn = [\lambda P(2n-1)/2]^{1/2} \quad (2)$$

Here, "Dn" is a distance between the center line I-I and the opened slit, "λ" is a wave length of the light source used in the exposure system, "P" is a distance between the mask surface and a point to which the diffracted light from the Fresnel zone pattern is condensed, namely the focal distance, and "n" is a natural number. When "n" is an even number, then it is a negative zone plate, in which the even-numbered lines from the center are transparent and the center line is non-transparent.

The light passed through the transparent portion has the most intensive light at the focal distance of the one-dimensional Fresnel pattern and the light is weakened as it departs from the focal point.

In the present embodiment, a second mask pattern 73 is provided at the center portion (in the center line I-I) of the first mask pattern 72 being the one-dimensional Fresnel pattern. The second mask pattern 73 is an L & S pattern having, for example, a line (linear pattern) size of 10 nm, a space size (distance between the adjacent linear patterns) of 100 nm.

Generally, the L & S pattern has smaller size variation with respect to the focus variation as compared to an isolated pattern. As the focus position of the aligner shifts and comes close to the light condensed position of the first mask pattern 72, the diffracted light from the first mask pattern 72 to the second mask pattern 73 forming an image is irradiated more intensively. In this case, therefore, the resist pattern after development being the transferred pattern of the second mask pattern 73 increases in size.

When the L & S pattern is used as a second mask pattern 73 for size measurement, the size variation of the resist pattern caused by the focus variation is extremely small when the first mask pattern 72 is not provided. With the provision of the first mask pattern 72, the size varies largely caused by the focus variation. Therefore, in other words, the focus variation can be recognized with extremely high sensitivity.

In the present embodiment, as in FIG. 5 of the first embodiment, the focus variation amount of the exposure system is specified using the test photomask 71 by steps S1, S2 on the assumption that presteps PS1, PS2 are in the completed state.

In the same manner as in the first embodiment, then, the focus variation of the exposure system is corrected by steps S3, S4.

As described above, according to the present embodiment, the position in focus, namely the best focused position, can be obtained easily and surely by the single exposure with high precision, allowing the highly-precise focus measurement in the extremely short period of time, so that the highly-reliable patterning can be performed speedy.

Note that, in the first to fourth embodiments, as in the present embodiment, the one-dimensional Fresnel zone pattern may be used as a mask pattern in place of the two-dimensional Fresnel zone pattern.

Also, needless to say, the art of the modification example of the first embodiment can apply to the respective second to fifth embodiments.

The above-described functions of the focus variation specifying section 13 of the focus measurement apparatus according to the first, second and fifth embodiments, the focus variation specifying section 13 and the difference value calculation section 18 of the focus measurement apparatus according to the modification example of the first embodiment, the focus variation specifying section 41 of the focus measurement apparatus according to the third embodiment, the focus variation specifying section 61 of the focus measurement apparatus according to the fourth embodiment, and the like can be realized by operation of a program stored in a RAM or a ROM of a computer.

Similarly, the respective steps (presteps SP1, PS2 and steps S1 to S4 in FIG. 5 in the first and fifth embodiments, presteps PS11 to PS13, steps S11 to S13 and steps S3 to S4 in FIG. 9 in the modification example of the first embodiment, presteps PS21, PS22, steps S21, S22 and steps S3, S4 in FIG. 13 in the second embodiment, presteps PS31, PS32, steps S31 to S35 and steps S3 to S4 in FIG. 17 in the third embodiment, presteps PS41, PS42, steps S41 to S43 and steps S3 to S4 in FIG. 21 in the fourth embodiment, and so on) of the focus measurement and correction methods in the respective embodiments can be realized by the operation of the programs stored in the RAM or the ROM of the computer. The program and the computer-readable record medium are within the scope of the present invention.

Specifically, the above-described program is recorded in the record medium such as a CD-ROM or provided to the computer via various transmission media. As a record medium recording the program, a flexible disk, a hard disk, a magnetic tape, a magnetic-optical disk, a nonvolatile memory card, and the like can be used, in addition to the CD-ROM. Meanwhile, as a transmission medium of the program, a communication medium in a computer network system to supply program information by propagating it as a carrier wave can be used. Here, the computer network means WAN such as LAN and Internet, a wireless communication network and the like; and the communication medium means a wire circuit such as an optical fiber, a wireless circuit, and the like.

Further, the program included in the present invention is not limited to that realizes the functions of the above-described embodiments by being supplied and executed by the computer. For instance, even when the program realizes the functions of the above-described embodiments in collaboration with OS (operating system) operating in the computer, the other application software and so on, such program is also within the scope of the present invention. Further, when all or part of the processing of the supplied program is performed by a function expansion board or a function expansion Unit of the computer to realize the functions of he above-described embodiments, such program is also within the scope of the present invention.

According to the present invention, the position in focus, namely the best focused position, can be obtained easily and surely by the single exposure with high precision, allowing a highly-precise focus measurement in the extremely short period of time, so that the highly-reliable patterning can be performed speedy.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A focus measurement apparatus comprising:
   a photomask including a first mask pattern with light condensing effect of which exposure-dose amount to a transfer object varies in dependence on a focus variation and a second mask pattern for size measurement formed to be projected to a light-condensed portion of the first mask pattern when exposed,
   a memory storing data indicating a relation between a size of a transferred pattern of the second mask pattern obtained using said photomask and a focus variation amount; and
   a focus variation amount specifying unit specifying the focus variation amount by making use of a fact that the size of the transferred pattern of the second mask pattern varies based on variation in the exposure-dose amount from the first mask pattern arising in dependence on the focus variation and by checking the measured size value with the data stored in said memory.

2. The focus measurement apparatus according to claim 1, wherein said photomask is a paired mask including a first photomask having the first mask pattern and a second photomask having the second mask pattern, and
   wherein a double exposure is performed using the first and second photomasks sequentially.

3. The focus measurement apparatus according to claim 1, wherein the first mask pattern is a Fresnel zone pattern with light condensing effect by diffraction, and
   wherein the second mask pattern is formed at a center portion of the first mask pattern.

4. The focus measurement apparatus according to claim 3, wherein the first mask pattern is a two-dimensional Fresnel zone pattern or a one-dimensional Fresnel zone pattern.

5. The focus measurement apparatus according to claim 1, wherein the second mask pattern is formed by plural linear patterns arranged in parallel.

6. The focus measurement apparatus according to claim 1, wherein said photomask further includes a third mask pattern for size measurement being a same mask pattern as of the second mask pattern,
   wherein said focus measurement apparatus further comprises a difference value calculator calculating a difference value being the measured size value of the transferred pattern of the second mask pattern subtracting a measured size value of a transferred pattern of the third mask pattern therefrom, and
   wherein said focus variation amount specifying unit specifies the focus variation amount by using correction data being respective sizes corresponding to respective focus variation amounts subtracting a size corresponding to a case in focus therefrom and by checking the difference value with the correction data.

7. A focus measurement apparatus comprising:
   a photomask including a Fresnel zone pattern with light condensing effect by diffraction, an exposure-dose amount of the Fresnel zone pattern to a transfer object varying in dependence on a focus variation;
   a memory storing data indicating a relation between a film thickness of a resist film being the transfer object from the Fresnel zone pattern obtained using said photomask and a focus variation amount; and
   a focus variation amount specifying unit specifying the focus variation amount by making use of a fact that the exposure-dose amount to a resist film depends on the focus variation and the film thickness of the resist film after development process depends on the exposure-dose amount and by checking a measured film thickness value of the resist film with the data stored in said memory.

8. A focus measurement apparatus comprising:
   a photomask including a Fresnel zone pattern with light condensing effect by diffraction formed thereon, an exposure-dose amount of the Fresnel zone pattern to a transfer object varying in dependence on a focus variation;
   an exposure-dose amount measurement unit measuring the exposure-dose amount from the Fresnel zone pattern;
   a memory storing data indicating a relation between the exposure-dose amount obtained using said photomask and said exposure-dose amount measurement unit and a focus variation amount; and
   a focus variation amount specifying unit specifying the focus variation amount by making use of a fact that the exposure-dose amount from the Fresnel zone pattern depends on the focus variation and by checking a measured value of the exposure-dose amount by said exposure-dose amount measurement unit with the data stored in said memory.

9. The focus measurement apparatus according to claim 8, wherein the Fresnel zone pattern is a two-dimensional Fresnel zone pattern or a one-dimensional Fresnel zone pattern.

10. A focus measurement method comprising:
    using a photomask including a first mask pattern with light condensing effect of which exposure-dose amount to a transfer object varies in dependence on a focus variation and a second mask pattern for size measurement formed to be projected to a light condensed portion of the first mask pattern when exposed;

storing data indicating a relation between a size of a transferred pattern of the second mask pattern obtained using said photomask and a focus variation amount, in a memory; and specifying the focus variation amount while making use of a fact that the size of the transferred pattern of the second mask pattern varies caused by variation in the exposure-dose amount from the first mask pattern arising in dependence on the focus variation and by checking the measured size value with the data stored in said memory.

11. The focus measurement method according to claim 10,
wherein the photomask is a paired mask including a first photomask having the first mask pattern and a second photomask having the second mask pattern, and
wherein a double exposure is performed using the first and second photomasks sequentially.

12. The focus measurement method according to claim 10,
wherein the first mask pattern is a Fresnel zone pattern with light condensing effect by diffraction, and
wherein the second mask pattern is formed at a center portion of the first mask pattern.

13. The focus measurement method according to claim 12,
wherein the first mask pattern is a two-dimensional Fresnel zone pattern or a one-dimensional Fresnel zone pattern.

14. The focus measurement method according to claim 11,
wherein the second mask pattern is formed by plural linear patterns arranged in parallel.

15. The focus measurement method according to claim 11,
wherein the photomask further includes a third mask pattern for size measurement being a same mask pattern as of the second mask pattern,
wherein said focus measurement method further comprises: calculating a difference value being the measured size value of the transferred pattern of the second mask pattern subtracting a measured size of a transferred pattern of the third mask pattern therefrom, before specifying said focus variation amount, and
wherein, in specifying said focus variation amount, the focus variation amount is specified by using correction data being the respective sizes corresponding to the respective focus variation amounts subtracting the size corresponding to a case in focus therefrom and by checking the difference value with the correction data.

16. A focus measurement method comprising:
using a photomask including a Fresnel zone pattern with light condensing effect formed thereon, an exposure-dose amount of the Fresnel zone pattern to a transfer object varying in dependence on a focus variation,
storing data indicating a relation between a film thickness of a resist film being the transfer object from the Fresnel zone pattern obtained using said photomask and a focus variation amount, in a memory; and
specifying the focus variation amount while making use of a fact that the exposure-dose amount from the Fresnel zone pattern to a resist film depends on the focus variation and at the same time the film thickness of the resist film after development depends on the exposure-dose amount, and by checking a measured film thickness value of the resist film with the data stored in said memory.

17. The focus measurement method according to claim 16,
wherein the Fresnel zone pattern is a two-dimensional Fresnel zone pattern or a one-dimensional Fresnel zone pattern.

18. A focus measurement method comprising:
measuring an exposure-dose amount from a Fresnel zone pattern with light condensing effect by diffraction using a photomask including the Fresnel zone pattern formed thereon, the exposure-dose amount of the Fresnel zone pattern varying in dependence on a focus variation;
storing data indicating a relation between the exposure-dose amount obtained by said measuring the exposure-dose amount with using said photomask and a focus variation amount, in a memory; and
specifying the focus variation amount by making use of a fact that the exposure-dose amount from the Fresnel zone pattern depends on the focus variation and by checking the measured value of the exposure-dose amount with the data stored in said memory.

19. The focus measurement method according to claim 18,
wherein the Fresnel zone pattern is a two-dimensional Fresnel zone pattern or a one-dimensional Fresnel zone pattern.

* * * * *